United States Patent [19]

Lyon

[11] Patent Number: 5,550,487

[45] Date of Patent: *Aug. 27, 1996

[54] APPARATUS AND METHOD FOR ALLOWING A SYNAMIC LOGIC GATE TO OPERATE STATICALLY

[75] Inventor: Richard F. Lyon, Los Altos, Calif.

[73] Assignee: Apple Computer, Inc., Cupertino, Calif.

[*] Notice: The term of this patent shall not extend beyond the expiration date of Pat. No. 5,440,243.

[21] Appl. No.: 482,671

[22] Filed: Jun. 7, 1995

Related U.S. Application Data

[63] Continuation of Ser. No. 295,157, Aug. 24, 1994, Pat. No. 5,440,243, which is a continuation of Ser. No. 124,820, Sep. 21, 1993, abandoned.

[51] Int. Cl.$^6$ ............................................. H03K 19/003
[52] U.S. Cl. ................................. 326/33; 326/21; 326/98
[58] Field of Search ........................... 326/21, 31, 33–34, 326/93, 95, 98

[56] References Cited

U.S. PATENT DOCUMENTS

| 5,051,620 | 9/1991 | Burgin | 307/452 |
| 5,440,243 | 8/1995 | Lyon | 326/33 |

FOREIGN PATENT DOCUMENTS

| 8200740 | 3/1982 | WIPO . | |

OTHER PUBLICATIONS

Charles M. Lee and Ellen W. Szeto, "Zipper CMOS," 1986, pp. 10–16.
Hery Fuchs, "1985 Chapel Hill Conference on Very Large Scale Integration", (Computer Science Press), pp. 88–94.
Jiren Yan and Christopher Sevensson, "High–Speed CMOS Circuit Technique," vol. 24, No. 1, Feb. 1989, pp. 62–70.
Marco Annaratone, "Digital CMOS Circuit Design," Kluwer Academic Publishers, pp. 103–124, Boston, 1986.
Fabricus, Eugene D., "Introduction to VLSI Design," pp. 196–218, McGraw–Hill, New York, 1990.
Mukherjee, Amar, "Introduction to NMOS and CMOS VLSI Systems Design," pp. 96–107, Prentice–Hall, Englewood Cliffs, NJ, 1986.

(List continued on next page.)

*Primary Examiner*—David R. Hudspeth
*Attorney, Agent, or Firm*—Blakely, Sokoloff, Taylor & Zafman

[57] ABSTRACT

A statically operated dynamic CMOS logic gate that includes an FET logic network for performing a predefined logic function with respect to its logic inputs, an output node, a precharge transistor, and in some embodiments an evaluate transistor. During operation, the precharge transistor is first turned on by a clock signal during a precharge phase to precharge an output node of the dynamic logic gate to a first voltage state. During the precharge phase, the evaluate transistor is turned off by the clock signal. An evaluate phase typically follows the precharge phase, and during the evaluation phase, the evaluate transistor is turned on by the control signal to allow the logic network to perform the predefined logic function with respect to its inputs, and the logic network selectively charges or discharges the output node to a second voltage state via the evaluate transistor in accordance with the predefined logic function given to the logic inputs to the logic gate. A driver circuit is provided for applying a bias voltage to the gate of the precharge transistor when the precharge transistor is not precharging the output node (e.g. the evaluate phase). The bias voltage has a voltage level that differs from the first voltage state by less than the magnitude of the threshold voltage of the precharge transistor in order for the precharge transistor to operate in a subthreshold conduction region so as to ensure the logic gate's output node to be at the first voltage state when the logic network does not discharge the output node to the second voltage state through the evaluate transistor as a result of the predetermined logic function. In this way, the dynamic logic gate circuit can operate statically with substantially minimized power consumption.

39 Claims, 22 Drawing Sheets

OTHER PUBLICATIONS

Uyemura, John P., "Fundamentals of MOS Digital Integrated Circuits," pp. 541–577, Addison–Wesley, Reading, MA, 1988.

Wang, Niantsu, "Digital MOS Integrated Circuits," pp. 304–314, 330–333, Prentice–Hall, Englewood Cliff, NJ, 1989.

Weste, N. and Eshraghian, K. "Principles of CMOS VLSI Design: A Systems Perspective," pp. 162–175, 320–325, 331–332, 371–380, Addision–Wesley, Reading, MA, 1985.

Patent Abstract of Japan, Saiki Yozo "Semiconductor Integrated Circuit Device," vol. 15, No. 323 (E–1101), Aug. 16, 1991.

Patent Abstract of Japan, Saiki Yozo "Dynamic Logical Gate, " vol. 16, No. 134 (E–1185), Apr. 6, 1992.

Prctorius et al., "Charge Redistribution and Noise Margins in Domino CMOS Logic," IEEE TCAS, vol. CAS–33, No. 8, pp. 786–793, Aug. 1986.

Geiger, Randall L. Allen, Phillip E. and Stader, Noel R., "VLSI Design Techniques for Analog and Digital Circuits," pp. 815–821, McGraw–Hill, New York, 1990.

Glasser, Lance A. and Dobberpuhl, Daniel W., "The Design and Analysis of VLSI Circuits," pp. 331–343, 375–385, Addison–Wesley, Reading, MA, 1985.

Hodges, David A. and Jackson, Horace G., "Analysis and Design of Digital Integrated Circuits 2nd edition," pp. 98–102, 340–345, 398–407, 312–316, 399–404, McGraw–Hill, New York.

Lyon, Richard, F. and Schediwy, Richard R., "CMOS Static Memory with a New Four–Transistor Memory Cell," in Advanced Research in VLSI Proceedings of the 1987 Stanford Conference (P. Losleben, ed.), MIT Press. 1987.

Mavor, J., Jack, M. A. and Denyer, P. B., "MOS LSI Design," pp. 100–105, Addison Wesley Publishers Ltd., London, 1983.

Figure 1a (Prior Art)
Figure 1b (Prior Art)
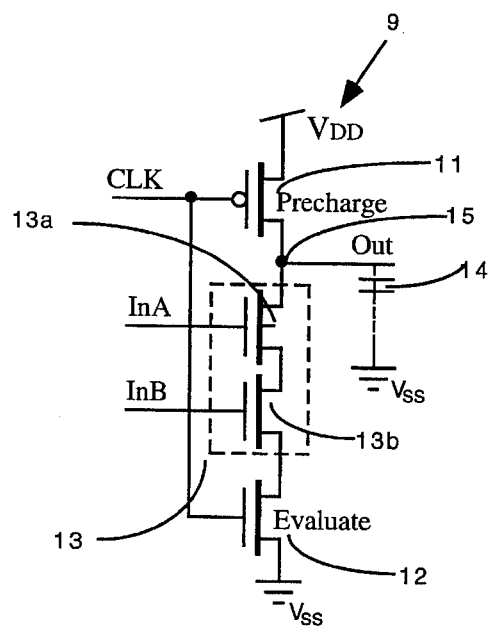
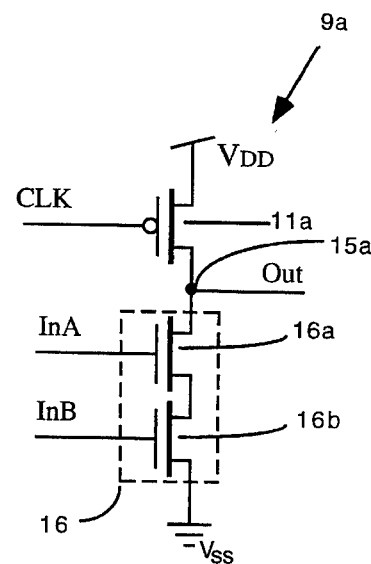
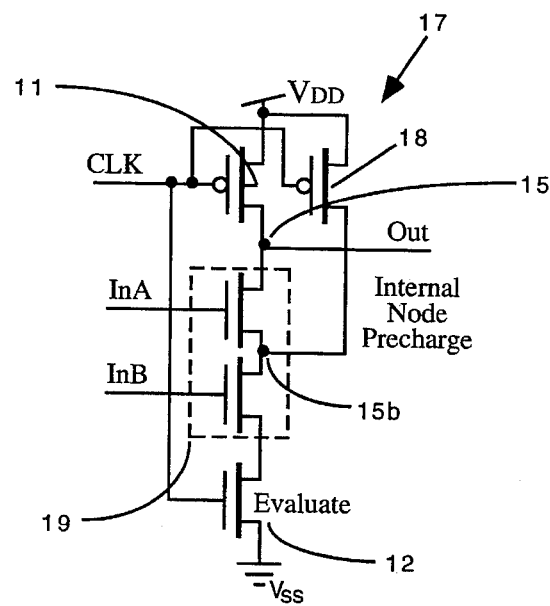
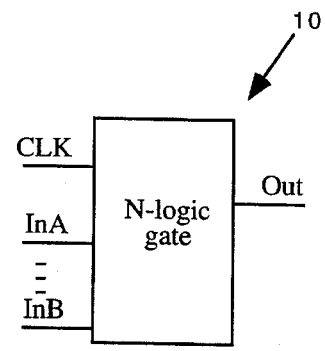
Figure 1c (Prior Art)
Figure 1d

APPARATUS AND METHOD FOR ALLOWING A SYNAMIC LOGIC GATE TO OPERATE STATICALLY

This is a continuation of application Ser. No. 08/295,157, filed Aug. 24, 1994 U.S. Pat. No. 5,440,243, which is a continuation of application Ser. No. 08/124,820, filed Sep. 21, 1993, abandoned.

FIELD OF THE INVENTION

The present invention pertains to the field of logic circuits. More particularly, this invention relates to circuitry and methods for allowing dynamic logic gate circuits to operate statically.

BACKGROUND OF THE INVENTION

Integrated CMOS logic circuits exist in two basic varieties: static and dynamic CMOS field-effect transistor ("FET") logic gates. Both varieties have at least one input and at least one output. A static CMOS logic gate typically requires no external clock signal to control its operation. Moreover, the static CMOS logic gate can preserve its state for as long as the power supply is applied to it. A dynamic CMOS logic gate, on the other hand, typically does not hold its state indefinitely and requires an external clock signal for its operation, which external clock defines alternating periods of precharging and evaluating the logic gate.

Dynamic CMOS logic gates tend to yield better performance, consume less power, and require less silicon area to be fabricated than static CMOS logic gates. Therefore, various dynamic circuits have been proposed, and FIGS. 1a, 1b and 1c illustrate various prior dynamic CMOS logic gates.

In FIG. 1a, a dynamic CMOS logic gate 9 comprises an NFET logic network 13, a precharge transistor 11, and an evaluate transistor 12. For illustration purposes NFET logic network 13 includes only NFETs (N-channel field effect transistors) 13a and 13b for performing a predefined logic function with respect to their inputs InA and InB. The particular N-logic gate shown in FIG. 1a provides a NAND function for the dynamic CMOS gate 9; it will be appreciated that other logic functions may be implemented, including standard (e.g. NOR, etc.) and random logic gates. Transistor 11 is a PFET (P-channel field effect transistor), and transistor 12 is an NFET (N channel field effect transistor). It will be appreciated that dynamic CMOS logic gates may also be implemented with a PFET logic (P-logic) network or with alternating NFET logic networks (N-logic) and PFET logic networks (as in the case of dynamic NORA). The state of dynamic CMOS logic gate 9 is stored on the parasitic capacitance of its output node, shown in phantom (dashed lines) as parasitic capacitor 14 coupled between output node 15 and ground or $V_{SS}$ or a predetermined reference voltage. A clock signal CLK is applied to the gate of transistors 11 and 12 to control the operation of gate 9.

As is well known in the art, the clock signal of a dynamic CMOS gate such as the gate 9 of FIG. 1a typically includes two phases (or periods) known as precharge and evaluate phases. The clock signal CLK is coupled to the gates of the precharge and evaluate transistors to control the precharge and evaluate phases, and the clock alternates between these phases. The clock waveform 701 of FIG. 7b shows that the clock signal has alternating phases which include the precharge phase when the clock is low (shown as 703) and the evaluate phase when the clock is high (shown as 702).

During the operation of the dynamic CMOS logic gate 9, the output (at node 15) of logic gate 9 is first precharged. The clock signal CLK is, during the precharge phase, at a logical low voltage state (shown as ground, which is one of several possible reference voltage states) that turns on transistor 11 to precharge the output node 15 of the gate 9. The clock signal CLK then, during the evaluate phase, changes its state to thereby turn off precharge transistor 11 and switch on evaluate transistor 12 to allow logic network 13 to perform its logic function with respect to its inputs InA and InB. Evaluation of the logic state of the logic network is only performed when the clock signal CLK is at logical high in the case of an N-logic network such as logic network 13. When the inputs of logic network 13 cause output node 15 to connect to ground, the electrical charge stored in the output node 15 is discharged through logic network 13 and transistor 12, and dynamic circuit 9 outputs a logical low signal. This action is referred to as conditional discharge since it occurs only when the logic function driven by inputs InA and InB specifies a logical low output. When the inputs of network 13 cause output node 15 not to connect to ground, output node 15 holds its electrical charge (provided by the precharge phase) and dynamic circuit 9 outputs a logical high signal as precharged by precharge transistor 11.

It will be appreciated that when a P-logic network is used in a CMOS dynamic logic gate, the precharge phase causes a discharge of the output node through an NFET (e.g. a pull-down to ground of the output node) and the p-logic network conditionally pulls up the discharged output node during the evaluate phase of the logic gate. P-logic networks are often used in alternating fashion with N-logic networks in NORA CMOS dynamic logic; see, for example pages 233–236 of CMOS Digital Circuit Technology, M. Shoji, Prentice Hall, 1988; and pages 171–172 of Principles of CMOS VLSI Design-A Systems Perspective, N. H. E. Weste and K. Eshraghian, Addison-Wesley Publishing Co., 1985.

FIGS. 1b and 1c illustrate alternative dynamic CMOS logic gates which are known in the prior art (again, N-logic networks are used in both cases, but P-logic networks may also be used according to the well known rules applicable to these logic networks). FIG. 1b shows a dynamic CMOS logic gate 9a where the evaluate transistor has been eliminated to achieve higher speed operation for the logic gate. The logic network 16 (containing for illustration purposes NFETs 16a and 16b to provide a NAND function for the logic gate) during the evaluate phase conditionally pulls-down the precharged output node 15a, which node was precharged by the precharge PFET 11a during the precharge phase of the clock signal. The clock signal "CLK" is coupled to the gate of the precharge PFET 11a to precharge the output node 15a to approximately a reference voltage, such as $V_{DD}$ during the precharge phase; typically the precharge occurs when the clock signal is a logical low which turns on the PFET 11a causing it to pull up the node 15a to approximately $V_{DD}$. During the evaluate phase, the clock signal is a logical high which turns off the PFET 11a, thereby allowing the N-logic network 16 to conditionally discharge the output node 15a.

FIG. 1c illustrates another prior art dynamic CMOS logic gate 17 wherein a node or nodes within the logic network ("internal nodes") are precharged as well as the output node. Again, a P-logic network may be used in place of the N-logic network 19 shown in FIG. 1c provided the well known rules applicable to these networks are followed. Precharging of internal nodes in the logic network is a useful technique when charge sharing is to be minimized. Charge sharing is a known problem with several prior art dynamic CMOS logic gates, and occurs whenever the output node of a logic gate shares charge with an intermediate (an internal node) along a series pull down (or pull up) path in the logic network. The precharging of internal nodes prevents charge sharing as the internal nodes are charged to the same level as the output node and thus will not tend to dissipate charge from the output node. The logic gate 17 operates in the same fashion as logic gate 9 of FIG. 1a except that PFET 18 charges the internal node 15b during the precharge phase of the clock signal while the PFET 11 charges the output node 15. During the evaluate phase of the clock, both PFETs 11 and 18 are completely off while the evaluate NEFF 12 is turned on to allow the logic network 19 to conditionally discharge the output node 15.

The different varieties of dynamic CMOS logic gates, such as those shown in FIGS. 1a, 1b and 1c, may be illustrated in a generic form because these different gates share common features such as at least one input and at least one output and a clock input for controlling the precharge and evaluate phases of the logic gate. FIG. 1d shows a generic form of a dynamic CMOS logic gate, and this generic form represents the different varieties, including those gates shown in FIGS. 1a, 1b and 1c. It will be understood that this generic gate 10 is coupled to two commonly used reference voltages (e.g. $V_{DD}$ and $V_{SS}$), even though not shown. This generic gate 10 may also represent a dynamic CMOS logic gate where a PFET logic network is used, although in this case, the clock signal used for this PFET network will be the complement of signal "CLK" (referred to as "clock bar" or $\overline{\text{CLK}}$ or "CLK-BAR"). This generic gate 10 will be used throughout this description in order to demonstrate that the invention may be used in many different types of dynamic CMOS logic gates.

As noted above, dynamic CMOS logic yields better performance in terms of speed and requires less silicon area to be fabricated than static CMOS logic. Nevertheless, for many CMOS integrated circuits (IC's), static CMOS logic is used because the IC is used in a portable device (e.g. a laptop computer) which must be powered by batteries; in this circumstance, as is well known, it is often necessary to conserve battery power by turning off or slowing down the system clocks of the portable device. Thus, in this circumstance, a chip designer faced with the trade off of (a) faster and denser dynamic CMOS logic versus (b) more conventional, larger, slower static CMOS logic, will select the static CMOS logic. However, the design of higher performance processors is now often requiring dynamic CMOS logic because of the performance advantages of dynamic CMOS logic. Thus, there exists a need to make dynamic CMOS logic operate statically in order to allow the system clocks to be stopped completely or to be run very slowly.

It will be appreciated that in conventional dynamic CMOS logic, such as the logic gates of FIGS. 1a, 1b and 1c, the clock cannot be stopped (or even run too slowly) because of the charge leakage off the output node of the gate. That is, when the precharging transistor is turned off for an extended period of time (e.g. because the clock has stopped in the evaluate phase or is running very slowly), then the charge on the precharged output node tends to leak off causing logic errors when the node should still be charged.

One prior approach to solving the problem of making a dynamic CMOS logic gate operate statically is shown in FIG. 2a and is also described on pages 168–169 of Weste and Eshraghian. As can be seen from FIG. 2a, an additional P-channel transistor 20 is coupled to the output node of the dynamic CMOS logic gate 10. Transistor 20 is a weak P-channel transistor which is coupled between the reference voltage (e.g. power supply) $V_{DD}$ and the output node of gate 10. Transistor 20 is always on, which provides a constant hold current to the output node during evaluation of the gate. This hold current typically overwhelms the leakage current, therefore preserving the state of the gate during evaluation and making the gate less sensitive to noise. This approach allows the logic gate 10 to be operated statically by turning off the clock (e.g. keeping the clock held high) or to be operated with a very slow clock.

This prior art approach has numerous disadvantages. One disadvantage is that the prior dynamic gate of FIG. 2a consumes relatively more power than the logic gate 10 itself. This is due to the fact that transistor 20 is maintained constantly on. The constant on transistor 20 typically causes the prior dynamic gate of FIG. 2a to dissipate more power during the evaluation phase.

Another disadvantage is that the prior approach of FIG. 2a results in the use of the extra transistor in the prior dynamic CMOS gate (i.e., transistor 20). It will be appreciated that PFET 20 is in addition to the precharge PFET 11. The extra transistor typically causes the prior dynamic gate of FIG. 2a to occupy more space on the semiconductor (e.g. silicon) substrate, which also tends to increase the cost of this prior dynamic CMOS gate. Moreover, because transistor 20 is a weak transistor, the channel of the transistor needs to be made extra long in order to make the transistor weak (Weste and Eshraghian note that the PFET 20's width/length ratio must be small, requiring that the channel length be made long). This typically causes transistor 20 to occupy more area on the semiconductor substrate. Furthermore, PFET 20 may impact the speed performance of the logic gate of FIG. 2a.

In addition to not being able to operate well statically, dynamic CMOS logic also tends to suffer from a lack of immunity to noise (e.g. from input glitches) and from a problem known as charge sharing, which was described above. The precharged output nodes tend to be very sensitive to noise, and it is dear that once a glitch causes an output node to discharge (or to "bleed off" some of the charge) during an evaluation phase, the node will erroneously remain discharged (or partially discharged) during that evaluation phase, thereby causing logic errors. This is unlike static CMOS where the constantly powered pull-up or pull-down devices tend to correct for the noise. Therefore, there is a need to provide better noise immunity and freedom from charge sharing in dynamic CMOS logic, and some solutions to these problems have been provided in the prior art. The static gate 10 of FIG. 2a is resistant to noise (e.g. glitch resistant) and thus tends to be "glitch robust" meaning that the gate is more tolerant of glitches.

FIG. 2b illustrates a prior approach which employs an extra transistor 23 with a bias voltage applied to the gate of transistor 23 in order to improve noise immunity. The approach of FIG. 2b also is glitch robust. The bias voltage biases the transistor 23 to generate a constant hold current, which typically ranges between 0.2 to 1 microampere ($\mu$A). This prior approach at improving noise immunity is described at pages 96–98 and shown at FIG. 3.78(b) of Introduction to nMOS and CMOS VLSI Systems Design, Amar Mukherjee, Prentice Hall, 1986. The constant hold current provides for noise immunity by keeping the output node from erroneously discharging as a result of an input glitch. The constant hold current also tends to keep the output node at its precharged state Coy supplying charge to the output node) even when charge sharing occurs when an internal node dissipates charge from the output node. Mukjerjee notes that when transistor 23 is a P-channel device (as shown in FIG. 2b), the bias voltage applied to the gate of the device is between $V_{DD}$ and $V_{SS}$. Note that transistor 23 is in addition to the precharge transistor of the dynamic CMOS logic gate 10. It appears that the bias voltage applied to the gate of the transistor 23 is above the threshold voltage of transistor 23.

One disadvantage of the prior approach of FIG. 2b is the use of the extra transistor 23 in each logic gate. The extra transistor typically causes this prior dynamic gate to occupy more space on the silicon substrate, as described above. Furthermore, the wiring needed to distribute a separate bias voltage to each logic gate of this type on a chip also causes this gate to occupy more area.

FIG. 2c illustrates another prior approach which attaches a weak P-channel transistor 21 with a feedback inverter 22 to the output node of the dynamic CMOS logic gate 10. The approach of FIG. 2c is not as "glitch robust" as the approaches of FIGS. 2a and 2b. Transistor 21 is controlled by a feedback signal from inverter 22 to provide a small hold current, making the output node of dynamic CMOS logic gate 10 less sensitive to noise but still not as glitch resistant as the circuits shown in FIGS. 2a or 2b. With the arrangement shown in FIG. 2c, transistor 21 is turned on only when the precharged state is to be preserved. This prior approach of FIG. 2c is also described at pages 168–169 of Weste and Eshraghian.

One disadvantage of this prior approach of FIG. 2c is the use of weak transistor 21 in the circuit. This prior approach uses an extra transistor in addition to the logic gate 10, which typically causes the prior dynamic gate of FIG. 2b to occupy more silicon space on the substrate during fabrication. As described above, a weak transistor typically occupies more space to manufacture. Thus not only is an extra transistor required for each logic gate, it is an extra large transistor. Moreover, an inverter (often a PFET and NFET) is also required for each logic gate thereby further increasing the size of each logic gate. In addition, the weak transistor must be adequately weak to be quickly and easily overcome by the pull down operation of the logic network during evaluation. Additional power is also consumed when the pull down by the logic network occurs because the pull down operation must overcome the current from PFET 21.

FIGS. 3a through 3c illustrate another prior approach to solving the problems of lack of noise immunity and charge sharing; this approach is described in an article entitled ZIPPER CMOS by C. M. Lee and E. W. Szeto, IEEE Circuits and Devices Magazine, pp. 10–16, May 1986. A basic prior Zipper CMOS structure typically includes a zipper clock driver circuit 31 and alternating N-logic and P-logic networks. FIGS. 3a–3c show only the N logic gate 30 and its associated zipper clock driver 31 of the zipper CMOS structure, for illustration purposes only. As can be seen from FIGS. 3a and 3b, zipper clock driver 31 applies a clock signal referred to as ST' to a precharge transistor 35 of the dynamic CMOS gate 30 (via line 33) and a clock signal ST, to an evaluate transistor 36 of the dynamic CMOS gate 30. The clock signal ST is the standard rail to rail clock used for prior dynamic CMOS gate, such as gate 9 of FIG. 1a; clock waveform 701 of FIG. 7b shows an example of this standard clock signal. Zipper logic requires that two separate clock signals be distributed to all N-logic gates and two more separate clock signals be distributed to all P-logic gates. This doubling of the number of globally distributed clock signals causes the zipper logic gates to occupy more semiconductor area than other logic gates and the extra clocks consume additional power relative to dynamic logic gates which use fewer clocks. Zipper logic is shown by Lee and Szeto to have two alternative clock driver circuits (known as type 1 and type 2 zipper driver circuits).

In the zipper CMOS approach, the voltage level of the $\overline{CLK}$ clock signal is modified by zipper clock driver 31 to provide the ST' signal such that precharge transistor 35 will stay slightly on during the evaluation phase. FIG. 3c illustrates both types of circuits of zipper clock driver 31 of FIG. 3a for N-logic gates in zipper logic. FIG. 4 illustrate the waveform of the ST' clock signal (curve 48), the ST signal (curve 47), and the $\overline{CLK}$ signal 406 (curve 49), which is the input to the zipper clock driver 31.

FIG. 3c shows a circuit diagram of a clock driver designed for use with N-logic gates in zipper logic, including both type 1 and type 2 alternatives and a generalized diode type 414. Normally, the zipper clock driver 31 has either PFET 416 (for the type 1 zipper driver) or NFET 418 (for the type 2 zipper driver) but not both. Diode 414 is not actually part of the circuit; it is shown merely to illustrate conceptually that PFET 416 or NFET 418 acts as a diode in the clock driver 31. The zipper clock driver 31 receives the $\overline{CLK}$ signal 406 as an input and produces two output clock signals ST 402 and ST' 404 to control N-channel evaluate transistors and P-channel precharge transistors respectively. When the input signal 406 is high, both outputs 402 and 404 are low, and when the input signal 406 is low, output ST 402 is high (e.g. $V_{DD}$) and output ST' 404 is driven below, by an offset, the high state of ST 402. The offset between the high level of ST 402 and the high level of ST' 404 is determined by the diode connected PFET 416 or the diode connected NFET 418. The result of the offset is that the precharge transistor 35 is partly on during the evaluate phase so that it provides noise immunity and solves charge sharing problems; this is described in detail by Lee and Szeto. It will be appreciated that P-logic gates in the zipper logic system are controlled by a clock driver circuit which is complementary to clock driver circuit 31.

Even though zipper logic has improved noise immunity and has less problems from charge sharing, it does have several disadvantages. One disadvantage of the zipper logic approach is the use of two separate clock signals distributed to each logic gate, thereby consuming more semiconductor area.

Another disadvantage is that one of two problems arises depending on the choice of diode means 414. If diode-connected PFET 416 is used, subthreshold conduction through transistor 416 will cause the voltage level of the ST' 404 signal to continue rising to higher voltages, reducing the offset voltage until transistor 416 and the precharging transistor 35 (FIG. 3b) which is driven by signal 404 are eventually all completely turned off. This prevents making the zipper logic gate operate statically.

If diode-connected NFET 418 is used, the clock signal ST' 404 will not rise up to the intended offset voltage since body effect on transistor 418 raises its effective threshold voltage substantially (i.e., typically about one volt). In this condition, precharge transistor 35 of dynamic CMOS logic gate 30 (FIG. 3b) will be turned on substantially above the threshold conduction region, and will operate at a relatively high power consumption, negating the power advantage of dynamic CMOS logic gates. Differences in the body effect parameters and in the magnitude of the threshold voltages between diode-connected NFET 418 and precharge transistor 35 of dynamic CMOS logic gate 30 (FIG. 3b) make the relative power consumption and stability of the zipper dynamic gate 30 unpredictable.

From the foregoing discussion it can be seen that a need exists in the prior art for apparatuses and methods for allowing a dynamic CMOS logic gate to operate statically. This need requires that the statically operated dynamic CMOS logic gate consumes substantially less power and operates faster than a static CMOS logic gate and that the dynamic gate take less space on a semiconductor substrate than a static CMOS logic gate. This need also requires an apparatus and method for reliably providing static operation with controllable and minimized power consumption without the risk that true static operation, when the system clocks are stopped (e.g. held high), will result in logic/data errors. There is also a need in the prior art to provide statically operated dynamic CMOS logic gates which have improved immunity against noise and against charge sharing.

SUMMARY OF THE INVENTION

A statically operated dynamic CMOS logic gate is described that includes an FET logic network for performing a predefined logic function with respect to its logic inputs, an output node, a precharge transistor, and in some embodiments an evaluate transistor. The evaluate transistor may be removed from the gate in some embodiments. During operation, the precharge transistor is first turned on by a clock signal during a precharge phase to precharge an output node of the dynamic logic gate to a first voltage state. During the precharge phase, the evaluate transistor is turned off by the clock signal. An evaluation phase typically follows the precharge phase, and during the evaluation phase, the evaluate transistor is turned on by the control signal to allow the logic network to perform the predefined logic function with respect to its inputs, and the logic network selectively charges or discharges the output node to a second voltage state via the evaluate transistor in accordance with the predefined logic function given to the logic inputs to the logic gate. A driver circuit is provided for applying a bias voltage to the gate of the precharge transistor when the precharge transistor is not precharging the output node (e.g. the evaluate phase). The bias voltage has a voltage level that differs from the first voltage state by less than the magnitude of the threshold voltage of the precharge transistor in order for the precharge transistor to operate in a subthreshold conduction region; this ensures that the logic gate's output node be at the first voltage state when the logic network does not discharge the output node to the second voltage state through the evaluate transistor as a result of the predetermined logic function. In this way, the dynamic logic gate circuit can operate statically with substantially minimized power consumption. In certain embodiments a delay circuit is also provided to allow the driver circuit to delay applying the bias voltage to the precharge transistor for a predetermined time interval after the precharge transistor is turned off by the clock signal. A method of allowing a dynamic CMOS logic gate to operate statically is also described.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIGS. 1a, 1b and 1c show prior art dynamic CMOS logic gates each with an N logic network;

FIG. 1d shows, in block diagram form, a generic logic gate;

FIG. 7a is a waveform diagram representing a comparison of clock signals CLK and MOD-HI-CLK of FIGS. 1a and 6a;

DETAILED DESCRIPTION

As will be described in more detail below, a dynamic CMOS logic gate according to the present invention includes a FET logic network for performing a predefined logic function with respect to its inputs, a precharge transistor, an evaluate transistor in some embodiments, and a means for providing a clock signal designed according to the invention. The means for providing a clock signal is typically a clock driver circuit which provides the clock phases that define the precharge and evaluate phases of the dynamic gate. The clock driver circuit generates a bias voltage which is applied to the gate of the precharge transistor when the precharge transistor is not precharging the output node (e.g. during the evaluate phase). The bias voltage applied to the gate of the precharge transistor has a voltage level that causes the gate-source voltage of the precharge transistor to be slightly less than the threshold voltage of the precharge transistor. The precharge transistor then operates in a subthreshold conduction region so as to weakly maintain the precharged state at the output node when the logic network does not discharge the output node to another voltage state (such as $V_{SS}$) as a result of the predefined logic function with respect to its inputs. This weak conduction ensures that the dynamic logic gate can operate statically by applying the bias voltage to the gate of the precharge transistor when the clock is stopped in the evaluate phase.

Figure 5:
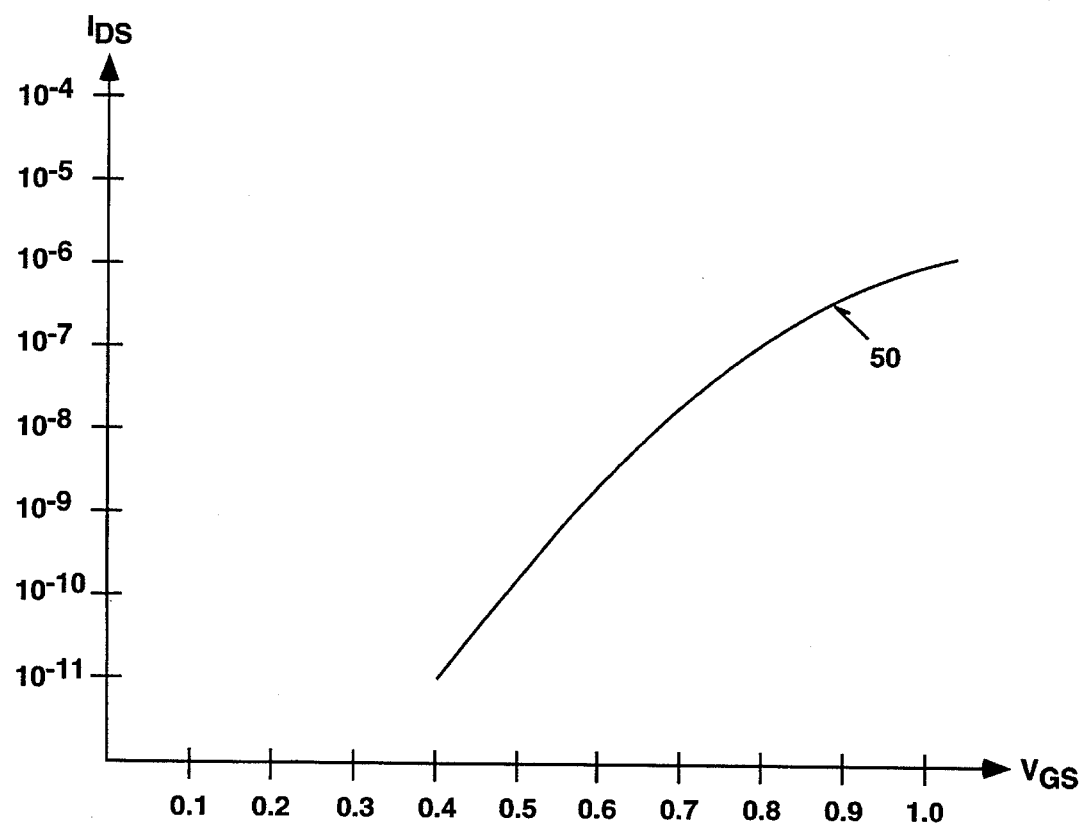
FIG. 5 is a current-voltage diagram of an FET transistor, illustrating the drain saturation current with respect to the gate-to-source voltage of the transistor.

FIG. 5 illustrates a curve 50 that depicts the relationship of the drain saturation current with respect to the gate-to-source voltage $V_{GS}$ for an N-channel FET transistor operating in the subthreshold conduction region. An FET transistor, when operating in the subthreshold conduction region, provides a saturation current which is an exponential function of the gate-to-source voltage over a range of currents from below one pico-ampere to approximately one micro ampere. For a typical N-channel enhancement type FET, the threshold voltage is about $V_{GS}$=0.7 volts; for a typical P-channel enhancement type FET, the threshold voltage is about $V_{GS}$=−0.7 v. The saturation current that the transistor is providing when in the subthreshold conduction region is a very small current, as can be seen from curve 50. This current, however, may be easily controlled to be sufficient to compensate for leakage current in a dynamic logic gate such that the dynamic logic gate can operate statically while still consuming substantially less power at high speed than a static circuit. The current will not, however, prevent the pull down network from pulling down the output node if the node should be pulled down from the precharge state given the inputs to the logic network.

Therefore, the subthreshold conduction region of the precharge transistor is used in the present invention to make elegantly simple dynamic logic gates that operate at extremely low power levels statically.

Figure 6A:
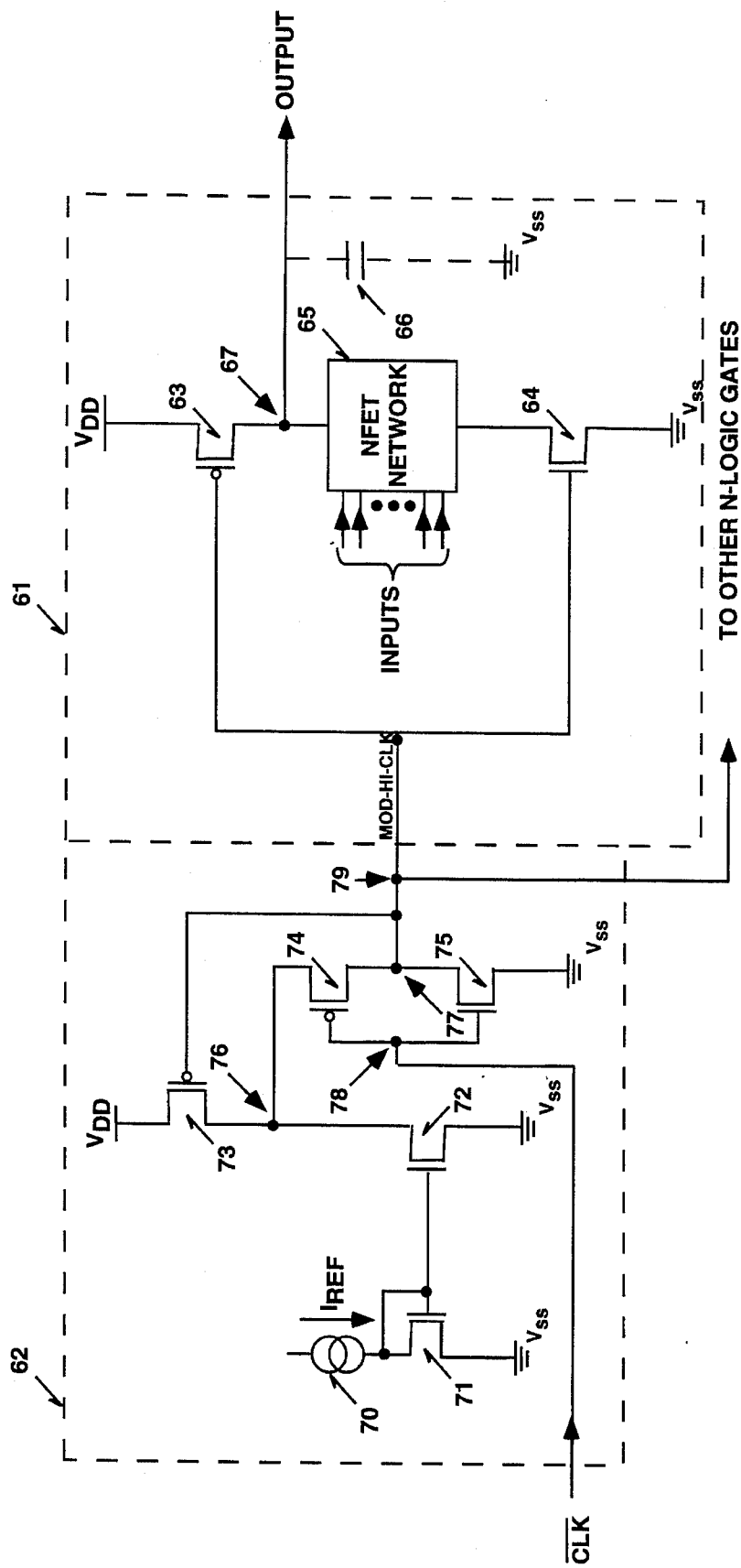
FIG. 6a is a circuit diagram of a dynamic CMOS logic gate (using an NFET logic network) and its clock driving and bias circuit, according to one embodiment of the present invention.
Figure 6B:
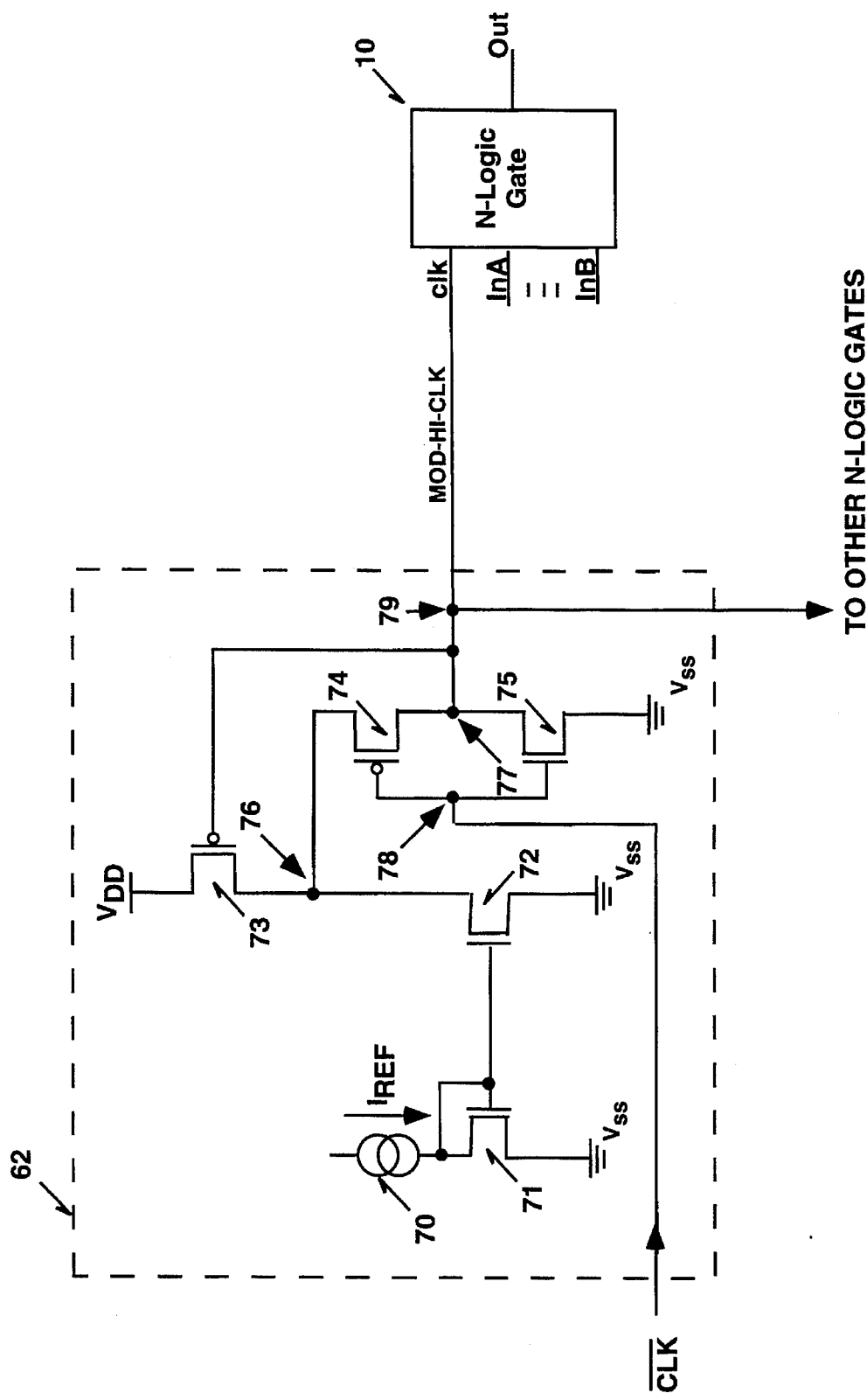
FIG. 6b shows, in block diagram form, a generic dynamic CMOS logic gate and its clock driver circuit according to the present invention.

FIG. 6a illustrates a clock driver circuit 62 that allows a dynamic CMOS logic gate 61 (which uses an NFET logic network) to operate statically, according to one embodiment of the present invention. In one embodiment, dynamic gate 61 is a precharge/evaluate logic gate (e.g. dynamic domino logic, NORA logic etc.). In other embodiments, dynamic circuit 61 can be any one of many other dynamic gates. For example, dynamic gate 61 can be one of a dynamic complementary set-reset logic ("CSRL") gate, or a dynamic transmission gate. In still other embodiments, dynamic gate 61 can be any dynamic array structure such as programmable logic arrays ("PLAs"), random access memories ("RAMs"), and read only memories ("ROMs") that use bit line precharging. Examples of these various alternatives are given below. FIG. 6b illustrates the wide applicability of the present invention to these various different types of dynamic logic gates. In particular, FIG. 6b shows the clock driver 62 (which in this specific embodiment provides a modified-hi-level clock signal) being provided to N-logic gate 10 which represents any one of the various dynamic logic gates which may be used with the present invention.

Referring again to FIG. 6a, dynamic gate 61 includes an NFET logic network 65, a precharge PFET 63, an output node 67 and an evaluate NFET 64. Alternatively in some embodiments, dynamic gate 61 may not include evaluate transistor 64 provided that the logic network can be assured by other means to be off (i.e. not pull down the output node to $V_{SS}$) during the precharge phase. Precharge PFET 63 has its source coupled to the power supply $V_{DD}$, its drain coupled to an output node 67, and its gate coupled to clock driver circuit 62 for receiving a MOD-HI-CLK signal (the modified-high level clock signal). Evaluate NFET 64 has its source coupled to ground and its gate coupled to receive the MOD-HI-CLK signal. An NFET network 65 is coupled between output node 67 and the drain of evaluate transistor 64. Network 65 receives at least one logic input and typically receives a plurality of logic inputs and performs a predefined logic function with respect to the logic inputs applied during the evaluate phase. A capacitor 66 is shown with dotted line connection to output node 67 and ground in order to indicate the parasitic capacitance of output node 67. It will be appreciated that capacitor 66 is not actually part of logic gate 61 but rather represents the inherent parasitic capacitance of the output node.

Clock driver circuit 62 controls the precharge and evaluate operations of dynamic gate 61 and provides a bias voltage ($V_{BIASP}$) to precharge transistor 63 during evaluation of dynamic gate 61 such that transistor 63 operates in the subthreshold conduction region to provide a subthreshold current to output node 67. This subthreshold current is used to replenish any charge which leaks off the output node 67 when network 65 does not discharge the charge stored in the output node 67 through transistor 64 during the evaluate phase. The subthreshold current therefore allows dynamic gate 61 to operate statically without losing its state even if the clock is held in the evaluate state for an extended period of time (this situation is an example of stopping the system clocks). The current is also referred to as keep-alive current. It shall, however, be noted that since transistor 63 operates in the subthreshold conduction region, the keep-alive current flowing through transistor 63 is very small, as described above in connection with FIG. 5.

Clock driver circuit 62 includes a bias transistor 73 that generates the bias voltage, a current source 70 for providing a reference current $I_{REF}$, and a current minor circuit formed by transistors 71 and 72 for controlling the current flowing through transistor 73 as a function of the reference current $I_{REF}$. The current mirror circuit is employed to control the generation of the bias voltage through transistor 73. The current minor circuit produces a current through transistor 73 that is proportional to the reference current $I_{REF}$ multiplied by a geometric width ratio of transistors 71 and 72. Hence the current flowing through transistor 73 is well regulated to generate the bias voltage for the P-channel transistor 63 (referred to as $V_{BIASP}$). By adjusting the various channel widths and the reference current $I_{REF}$, the current on transistor 73 can be adjusted. The use of a current mirror to generate a bias voltage in a driver circuit, including a bias voltage which controls a transistor so that it operates in the subthreshold conduction region, is known and has been described in U.S. Pat. No. 4,796,227. However, this prior art patent did not utilize a bias voltage to allow a dynamic CMOS logic gate to operate statically.

Clock driver 62 also includes an inverter formed by PFET 74 and NFET 75. The inverter is used in clock driver circuit 62 to cause the MOD-HI-CLK signal to be selectively at $V_{SS}$ potential or the bias potential under the control of the clock signal $\overline{CLK}$ which serves as an input signal to the clock driver 62. The inverter formed by transistors 74 and 75 has an output node 79, which is also the output node of clock driver circuit 62. The MOD-HI-CLK signal is used to control the switching between the precharge operation and the evaluate operation of dynamic gate 61. In a typical embodiment, the input signal $\overline{CLK}$ to the clock driver 62 is the same as the clock input signal which is, after an inverter, applied to the gates of the precharge and evaluate transistors of the prior art dynamic CMOS logic gate (e.g. transistors 11 and 12 respectively of gate 9 of FIG. 1a). This input signal is thus the standard "rail to rail" clock levels shown in clock waveform 701 of FIG. 7b, where the clock signal alternates between two reference voltages 702 and 703, such as $V_{DD}$ and $V_{SS}$ respectively. This input signal $\overline{CLK}$ will produce, via the clock driver 62, an output signal at node 79 which is the MOD-HI-CLK signal, which is shown as clock waveform 710 of FIG. 7b. As can be seen from clock waveform 710, the MOD-HI-CLK signal alternates between two voltage levels which are $V_{SS}$ (logical low) and the bias voltage $V_{BIASP}$; as shown by waveform 710, the state 711 represents the time when the MOD-HI-CLK signal is at the bias voltage ($V_{BIASP}$) (the evaluate phase), and the state 712 represents the time when the MOD-HI-CLK signal is at the reference voltage $V_{SS}$ (the precharge phase). It will be appreciated that, if power is to be conserved in the system which includes the logic gate 61, then the system clocks may be "stopped" by setting the MOD-HI-CLK signal in the evaluate phase at the bias voltage $V_{BIASP}$ for an extended period of time. Alternatively, as is well known, power may be conserved by slowing the frequency of the system clocks; this would typically occur by using conventional techniques to decrease the frequency of the input signal $\overline{CLK}$ to the clock driver 62. The operation of clock driver 62 will now be described in detail below.

During the precharge phase, the inverter formed by transistors 74 and 75 quickly drives the MOD-HI-CLK signal to $V_{SS}$ to turn transistor 63 on and transistor 64 off when the $\overline{CLK}$ signal is at a logical high voltage state, to cause the precharge of dynamic gate 61. Then, during the evaluate phase which typically follows the precharge phase, the inverter quickly returns the MOD-HI-CLK signal to the bias potential $V_{BIASP}$ to turn on evaluate transistor 64 and to cause transistor 63 to operate in the subthreshold conduction region; this occurs when the $\overline{CLK}$ signal switches its voltage state to logical low to evaluate dynamic gate 61. If the voltage level of the MOD-HI-CLK signal does not rise fast (in going from $V_{SS}$ to $V_{BIASP}$), the power consumption of dynamic gate 61 will increase. Due to the circuit arrangement of clock driver circuit 62, the voltage level of the MOD-HI-CLK signal can quickly rise to the bias voltage $V_{BIASP}$ which allows dynamic gate 61 to operate fast while consuming less power. This will be described in more detail below.

Transistors 71–72 and 75 are NFETs and transistors 73 and 74 are PFETs. PFET 73 has its gate coupled to output node 79. As a consequence, PFET 73 turns off slower while PFET 74 turns on harder (relative to another clock driver described below) when the $\overline{CLK}$ signal changes its voltage state in going from the precharge phase to the evaluate phase, thus allowing clock driver circuit 62 to switch its output fast while reducing power consumption in gate 61. This gate connection of transistor 73 is referred to as pseudo-diode connection.

When the $\overline{CLK}$ signal is switched from the logical high voltage state ($V_{DD}$) to a logical low voltage state ($V_{SS}$) after output node 67 is precharged to the high voltage state, transistor 75 is switched off and transistor 74 is turned on. At this moment in the transition from precharge to evaluate, current flows through transistor 74, and the voltage drop across transistor 74 begins to decrease. Because the gate of FET 73 is coupled to the drain of FET 74, the voltage applied to the gate of FET 73 is the same as the combined voltage drops across FETs 73 and 74. Thus, during the beginning of the evaluate phase (while $\overline{CLK}$ is falling from $V_{DD}$ to $V_{SS}$), the FET 73 remains on longer and harder (as the FET 74 begins to conduct) thus supplying more charge to the output node 79 thereby pulling it faster to the bias voltage $V_{BIASP}$. This causes output node 79 to quickly settle to the bias voltage. Once output node 79 settles to the bias voltage $V_{BIASP}$, the voltage drop across transistor 74 approaches zero, and transistor 73 becomes effectively diode-connected. At this moment, the bias voltage is determined by the current flowing through transistors 72 and 73.

The bias voltage at output node 79 turns on transistor 64 for evaluating the logic function of network 65 with respect to its inputs. At this time, the bias voltage at output node 79 causes the voltage level of the gate-source voltage $V_{GS}$ of transistor 63 to be less than the threshold voltage of transistor 63. This thus causes transistor 63 to operate in the subthreshold conduction region. Transistor 63, when operating in that region, allows only a substantially reduced saturation current to flow through. The small current flowing through a transistor in such region is within the range of 1 pA (pico-ampere) to 1 mA (micro-ampere), as described above with respect to FIG. 5. In one embodiment, the bias voltage $V_{BIASP}$ generated by the driver circuit 62 during the evaluate phase is in a range of 4.2 volts to 4.6 volts, assuming that $V_{DD}$ is 5 volts and $V_{SS}$ is 0 volts. Of course, the actual $V_{BIASP}$ will vary depending on $V_{SS}$ and $V_{DD}$ and on the nature of the transistors in the driver; in any case, however, the bias voltage should be enough to achieve subthreshold conduction in the precharge transistor during the evaluate phase.

This small saturation current is, however, sufficient to compensate for any charge leakage off the output node 67 when network 65 does not discharge the precharged voltage at output node 67 to $V_{SS}$. This ensures that dynamic gate 61 does not lose its precharged state during evaluation of the gate, thus allowing dynamic gate 61 to operate statically. As described above, this current is also referred to as keep-alive current as it helps to preserve the precharged voltage state at output node 67.

During evaluation, network 65 is allowed to perform the predefined logic function with respect to its inputs. The outcome of the logic function appears at output node 67. If network 65 couples output node 67 to ground via the turned-on evaluate transistor 64 as a result of its logic function with respect to its inputs, output node 67 is discharged to $V_{SS}$ and outputs a logical low output signal represented by $V_{SS}$. Because transistor 63 now operates in the subthreshold conduction region, the very small keep-alive current flowing through transistor 63 does not affect the output of gate 61 (e.g. the keep-alive current will not overwhelm the result of the network 65 if the network discharges the node 67 to $V_{SS}$) and does not cause dynamic gate 61 to dissipate more power during the switching. In addition, the very small keep-alive current does not materially affect the speed at which output node 67 discharges to $V_{SS}$.

If network 65 does not connect output node 67 to $V_{SS}$ via the turned-on evaluate transistor 64 as a result of its logic function with respect to its inputs, output node 67 is maintained at the precharged voltage state ($V_{DD}$) which represents a logical high output signal. Because transistor 63 is operating in the subthreshold conduction region, the very small keep-alive current generated by transistor 63 compensates for any charge leakage off node 67, therefore preserving the precharged high voltage state at output node 67.

It will be appreciated that the clock driver 62 may be used to make the dynamic CMOS logic gate 61 operate statically without any change to the internal circuitry for logic gate 61. Thus, the logic gate may be any one of the prior N-logic gates, as illustrated by logic gate 10 of FIG. 6b, without any change to the circuitry of logic gate 10. It will also be understood that a plurality of N-logic gates 10 may be driven by the clock driver 62 to allow the plurality of gates to operate statically.

Figure 7A:
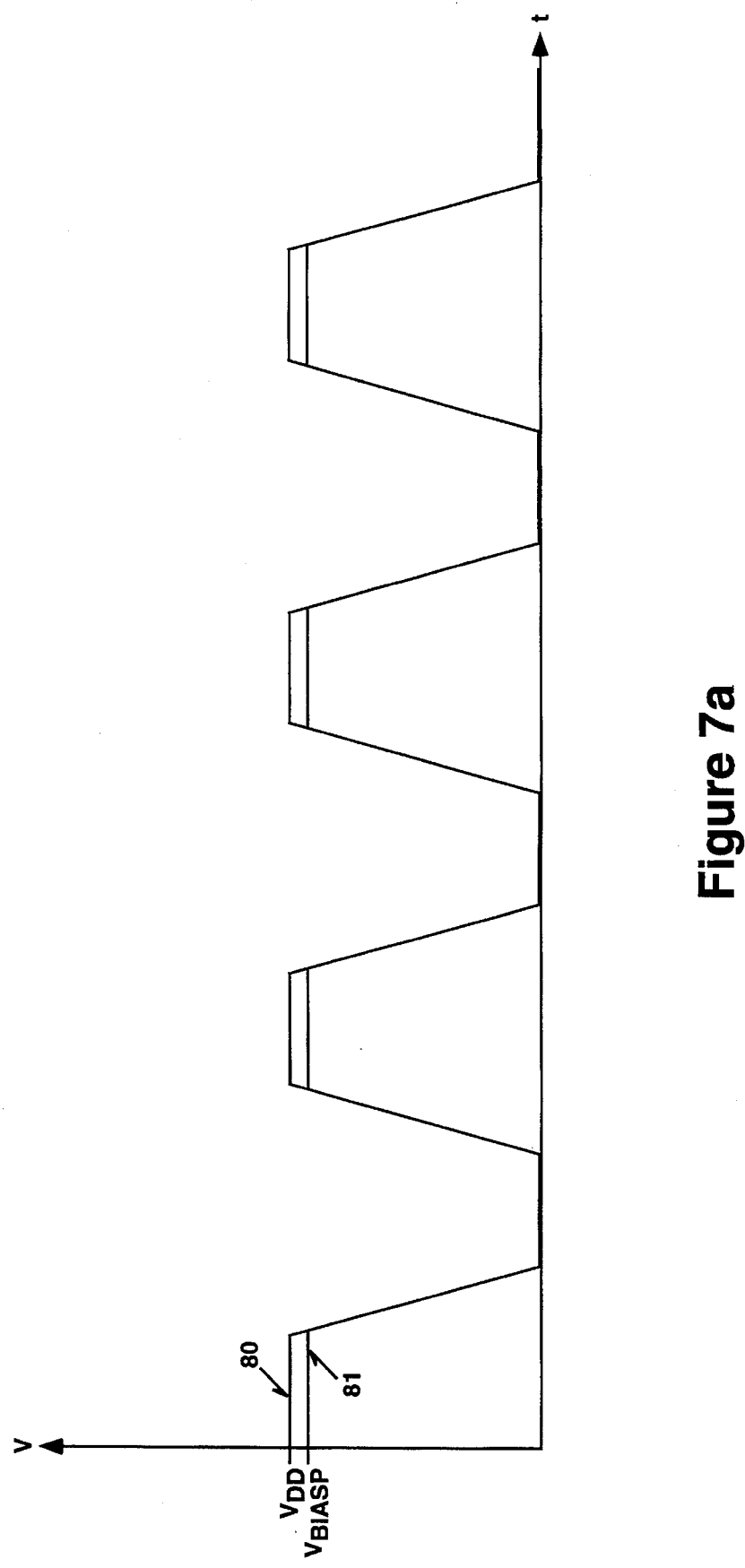

FIG. 7a illustrates a comparison of the waveform of the MOD-HI-CLK signal applied to dynamic gate 61 of FIG. 6a with that of the CLK signal applied to prior dynamic gate 9 of FIG. 1a. In FIG. 7a, curve 80 represents the CLK signal generated by a conventional clock driver and curve 81 represents the MOD-HI-CLK signal generated by clock driver circuit 62 of FIG. 6a, according to the present invention. As shown in FIG. 7, the CLK signal alternates between $V_{SS}$ and the $V_{DD}$ voltage (curve 80) while the MOD-HI-CLK signal alternates between $V_{SS}$ and the bias voltage $V_{BIASP}$ (curve 81) which is lower than the $V_{DD}$ voltage.

Figure 8:
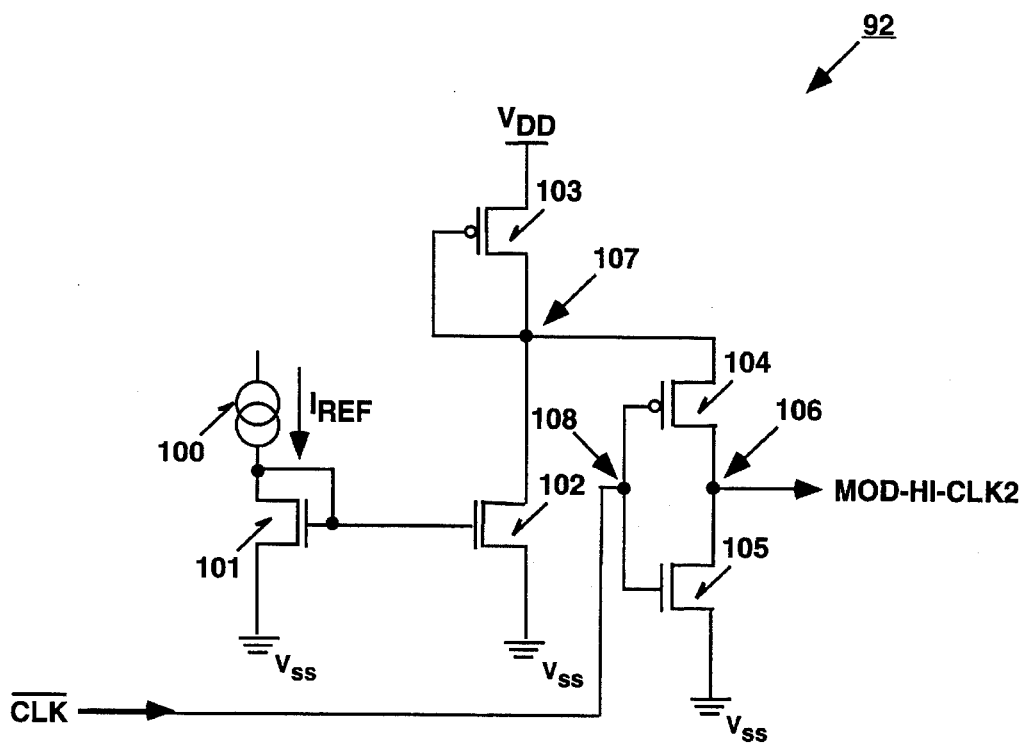
FIG. 8 is a circuit diagram of a clock driving and bias circuit for N-logic gates, according to another embodiment of the present invention.

FIG. 8 illustrates another clock driver circuit 92 that allows dynamic gate 61 or dynamic gate 10 to operate statically, according to another embodiment of the present invention. In FIG. 8, bias circuit 92 is analogous to bias circuit 62 of FIG. 6a, except that bias transistor 103 of FIG. 8 is diode-connected, and the output signal is labelled MOD-HI-CLK2.

Clock driver circuit 92 is slower in causing its output node 106 to settle to the bias voltage $V_{BIASP}$ than driver circuit 62 of FIG. 6a, thus causing the dynamic gate to which driver 92 is coupled to dissipate relatively more power during the precharge to evaluate transition. This is due to the fact that bias transistor 103 is only diode-connected, and the gate voltage applied to transistor 103 does not include the voltage drop across transistor 104 and thus the PFET 103 is not on as much as PFET 73 during the precharge phase and so, in transitioning from precharge to evaluate phases, PFET 103 pulls up node 106 slower than PFET 73 pulls up node 79. During the initial period of the evaluation phase, FET 103 does not remain on as long and as hard as FET 73 of FIG. 6a; consequently less charge is supplied, in the initial period of the evaluation phase, to charge the output node 106 as compared to the output node 79 of the driver 62. The resulting delay in getting to the bias voltage means that the evaluate transistor is turned on slower than if driver 62 is used, and this helps to minimize charge sharing problems because, during the delay, the load current from the ending portion of the precharge phase helps to replace charge lost to charge sharing. The use of clock driver 92 may result in some slowing of switching speed but this slowing may be negligible or may be easily tolerated in exchange for improvements in handling charge sharing.

Figure 9:
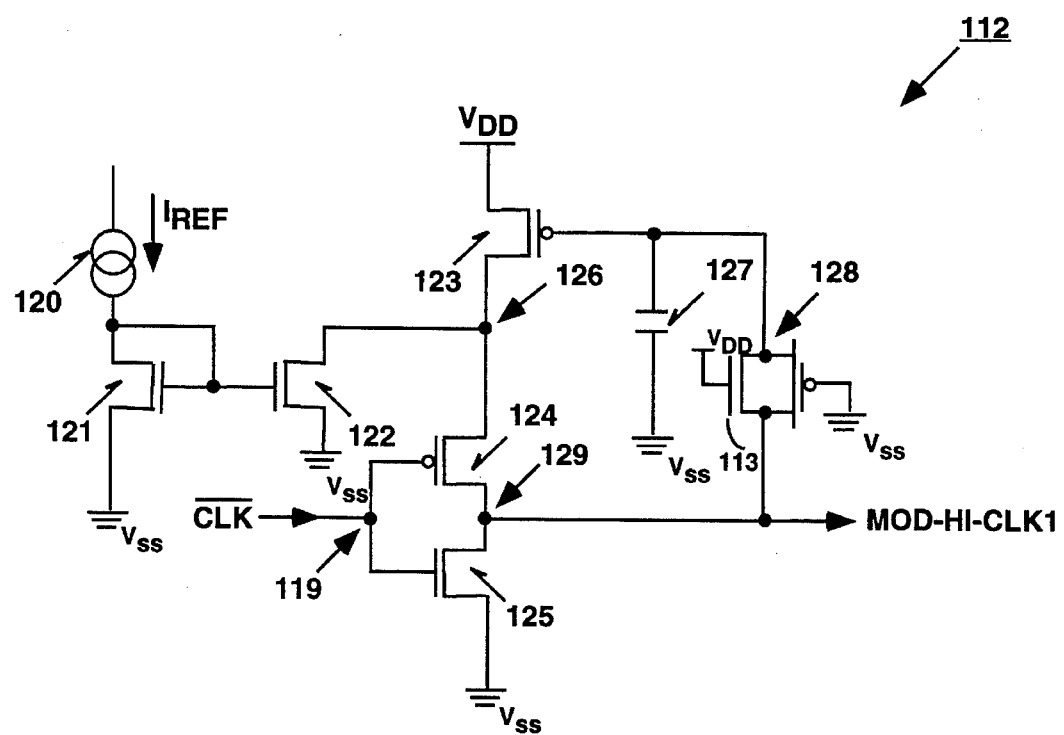
FIG. 9 is a circuit diagram of a clock driving and bias circuit for N-logic gates, according to a further embodiment of the present invention.

FIG. 9 illustrates another clock driver circuit 112 that allows a dynamic gate, such as dynamic gate 10, to operate statically according to a further embodiment of the present invention. In FIG. 9, clock driver circuit 112 is analogous to clock driver circuit 62 of FIG. 6a, except for the following two differences: 1) the gate of bias transistor 123 is connected via PFET 128 (which has its gate coupled to $V_{SS}$) and via NFET 113 (with its gate coupled to $V_{DD}$) to output node 129 of bias circuit 112; and 2) the gate of the bias transistor 123 is connected to a capacitor 127 (which is coupled between the gate and $V_{SS}$) The gate of transistor 123 is connected to PFET 128, NFET 113 and capacitor 127 in order to delay transistor 123 from generating the bias voltage $V_{BIASP}$. That is, PFET 128, NFET 113 and capacitor 127 cause transistor 123 to momentarily exceed the bias voltage and thereby delay generating the bias voltage for the precharge transistor in the logic gate for a predetermined time interval when the $\overline{CLK}$ signal switches its voltage state (in transitioning from the precharge to the evaluate phase) to turn on transistor 124 and turn off transistor 125. This causes the precharge transistor (e.g. PFET 63 in FIG. 6a) to be completely turned off initially during the evaluate phase and then turned on in the subthreshold conduction region, during the remainder of the evaluate phase, to provide the keep-alive current to the output node of the logic gate. It will be appreciated that a resistor may be substituted for PFET 128 and NFET 113 such that one end of the resistor is coupled to the output node 129 and the other end of the resistor is coupled to the gate of PFET 123.

Figure 10:
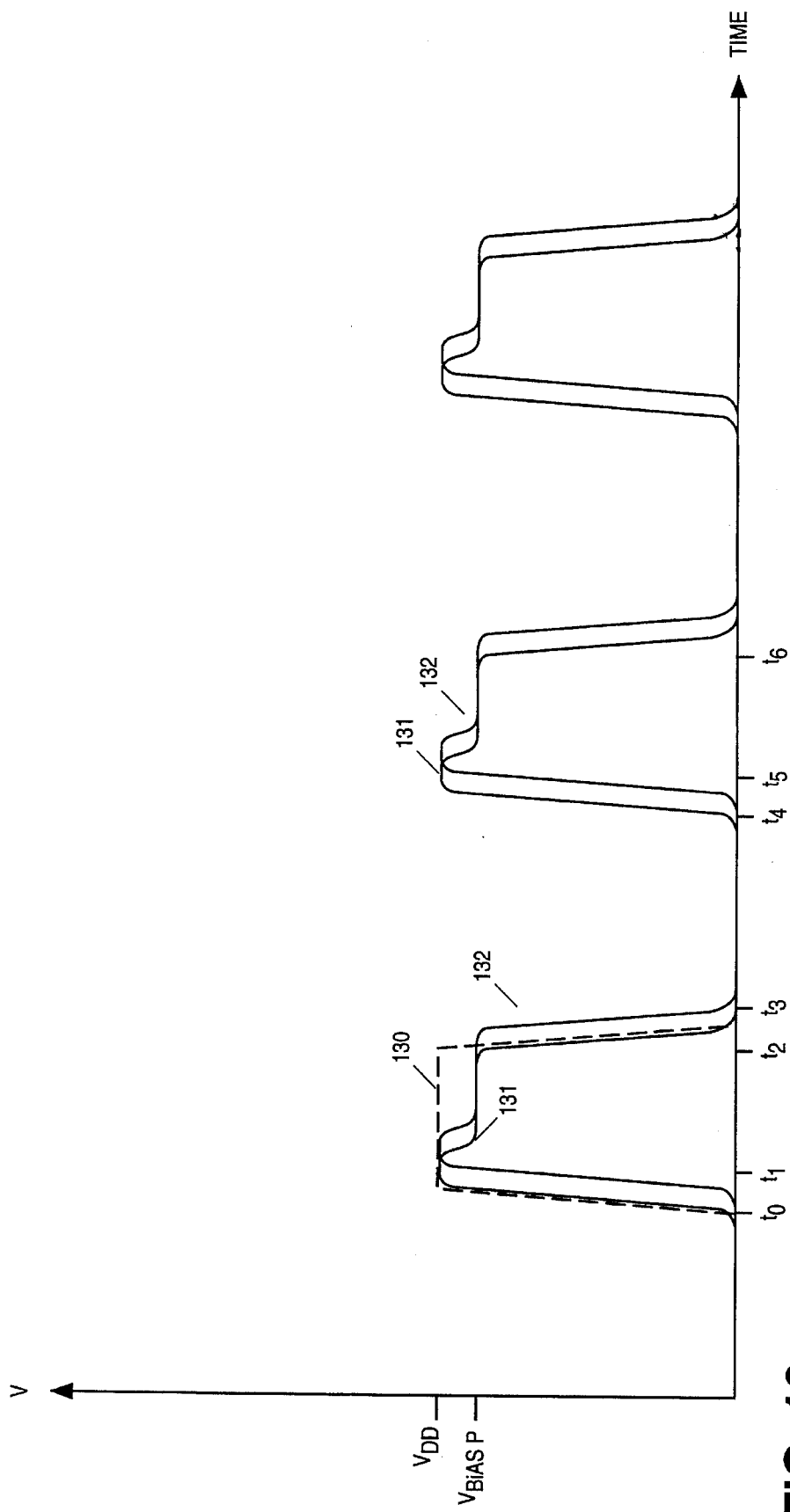
FIG. 10 is a waveform diagram representing a comparison of clock signals CLK and MOD-HI-CLK1 of FIGS. 1a and 9.

To better understand the delaying effect of PFET 128 and NFET 113 and capacitor 127, a description of the operation of circuit 112 during high and low clock signals $\overline{CLK}$ is helpful. When the $\overline{CLK}$ signal is high (during precharge), MOD-HI-CLK1 (the output of circuit 112 at node 129) is pulled down to $V_{SS}$, because the high $\overline{CLK}$ signal turns on NFET 125 and turns off PFET 124. Also, because PFET 128 and NFET 113 act as a resistor, when the $\overline{CLK}$ signal is high, MOD-HI-CLK1 pulls down the gate of transistor 123 and the capacitor 127 is charged to $V_{SS}$. However, when the $\overline{CLK}$ signal transitions from high to low, MOD-HI-CLK1 signal rises to the logical high level because the low $\overline{CLK}$ signal turns PFET 124 on and turns NFET 125 off. In addition, the ground potential that capacitor 127 stored during the high $\overline{CLK}$ period keeps transistor 123 on very hard initially (after the transition of $\overline{CLK}$ from high to low) which in turn causes MOD-HI-CLK1 to quickly rise to $V_{DD}$. This rapid rise is demonstrated in FIG. 10, which shows the MOD-HI-CLK1 curve 131 (showing the output of driver circuit 112 at node 129) quickly reaching $V_{DD}$ as the CLK signal (shown as curve 130 which represents the waveform of the inverse of the $\overline{CLK}$ signal) rises towards $V_{DD}$.

However, after a short delay (shown as the period between $t_0$ and $t_1$, on FIG. 10), the high MOD-HI-CLK1 signal (via PFET 128 and NFET 113) charges capacitor 127 to the $V_{DD}$ potential. This is demonstrated in FIG. 10 wherein curve 132 represents the voltage stored on capacitor 127. As it can be seen from FIG. 10, as the voltage across capacitor 127 approaches $V_{DD}$, the MOD-HI-CLK1 signal at output node 129 falls to the $V_{BIASP}$ potential. The MOD-HI-CLK1 signal is reduced because transistor 123 acts as a pseudo-diode when the voltage at its gate approaches $V_{DD}$; the voltage drop across transistor 123 is controlled by the current that the current mirror (formed by NFETs 121 and 122) and current source 120 establish through transistor 123.

The duration of the delay (e.g. the amount of time that MOD-HI-CLK1 signal equals $V_{DD}$) is approximately equal to the product of the capacitance of capacitor 127 and the resistance of PFET 128 and NFET 113 (or the resistor which may be substituted for PFET 128 and NFET 113). For example, if the capacitance of capacitor 127 is 0.1 pF and the parallel resistance of transistors 128 and 113 is 10 kΩ, the delay interval is 1 nanosecond (ns). A typical delay interval may be in the range of 1 to 10 ns.

By momentarily exceeding the bias voltage, the clock driver circuit 112 increases the switching speed of a dynamic gate (e.g. dynamic gate 10 of FIG. 1d). The switching speed of a dynamic gate is increased since during an initial period of the evaluation phase the MOD-HI-CLK1 signal equals $V_{DD}$, which in turn completely turns on the evaluate FET and completely turns off the precharge transistor (e.g. PFET 63 in FIG. 6a) of an N-logic network. During this initial period, the voltage drop at the output of an N-logic network due to leakage currents is very low, and thus there is no need for the precharge transistor to supply a subthreshold keep-alive current. However, as time passes during the evaluate phase, the leakage current increases the voltage drop at the output of the N-Logic network. Consequently, the magnitude of the MOD-HI-CLK1 signal decreases to $V_{BIASP}$, which is a voltage that causes the precharge transistor to operate in a subthreshold conduction region during the remainder of the evaluate phase; in the subthreshold conduction region, the precharge transistor provides a keep alive current to the output node of the N-logic network (e.g. node 67 in FIG. 6a), and thus allows the dynamic gate to operate statically. The clock driver circuit 112, shown in FIG. 9, is particularly useful in circumstances where switching speed is important or critical and there is little or no charge-sharing problem. In those circumstances where charge-sharing is a problem, then the clock driver 92 of FIG. 8 may be better than driver 112 without too much loss of switching speed.

Figure 11A:
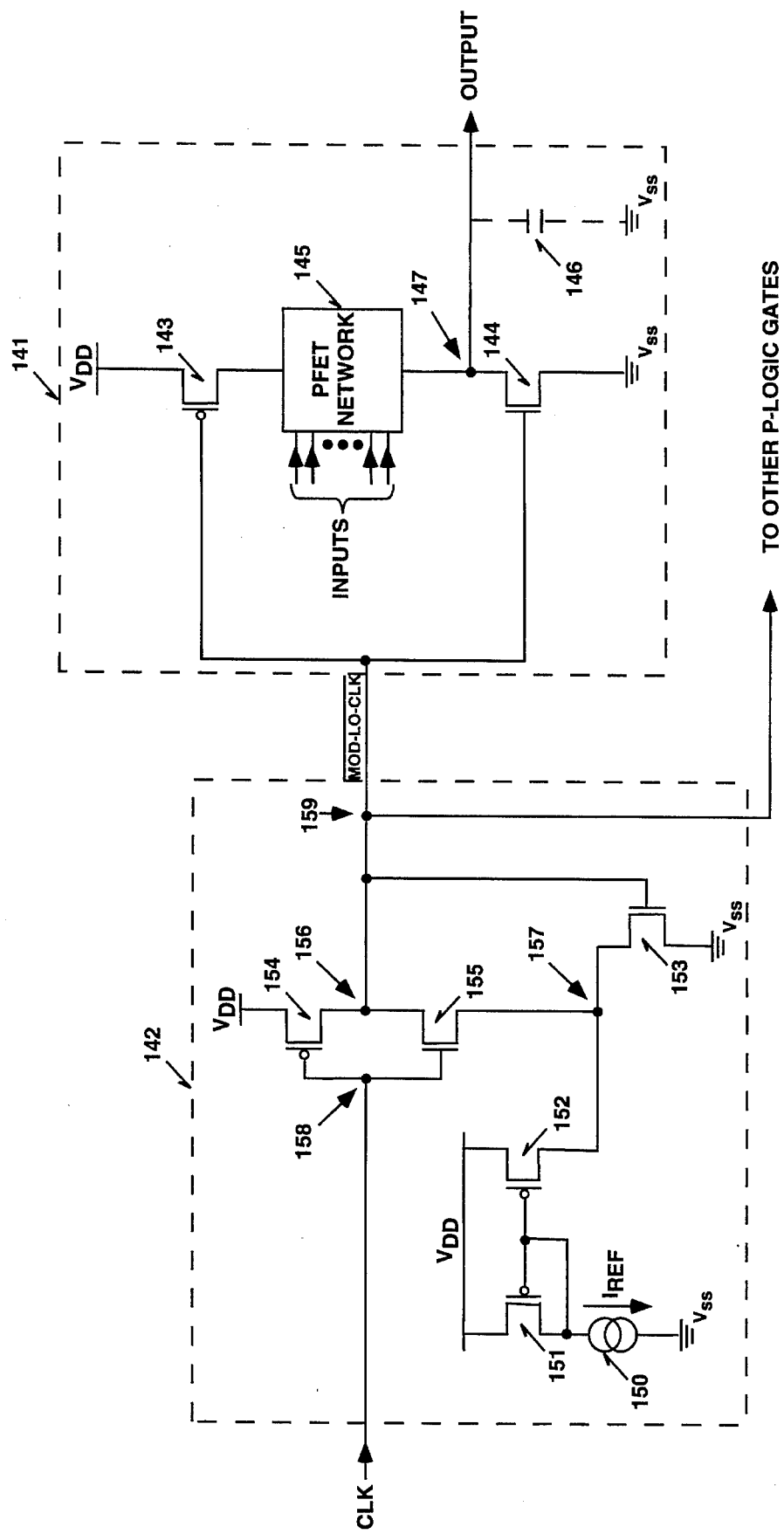
FIG. 11a is a circuit diagram of a dynamic CMOS logic gate (with a P-logic network) and its clock driving and bias circuit, according to one embodiment of the present invention.
Figure 11B:
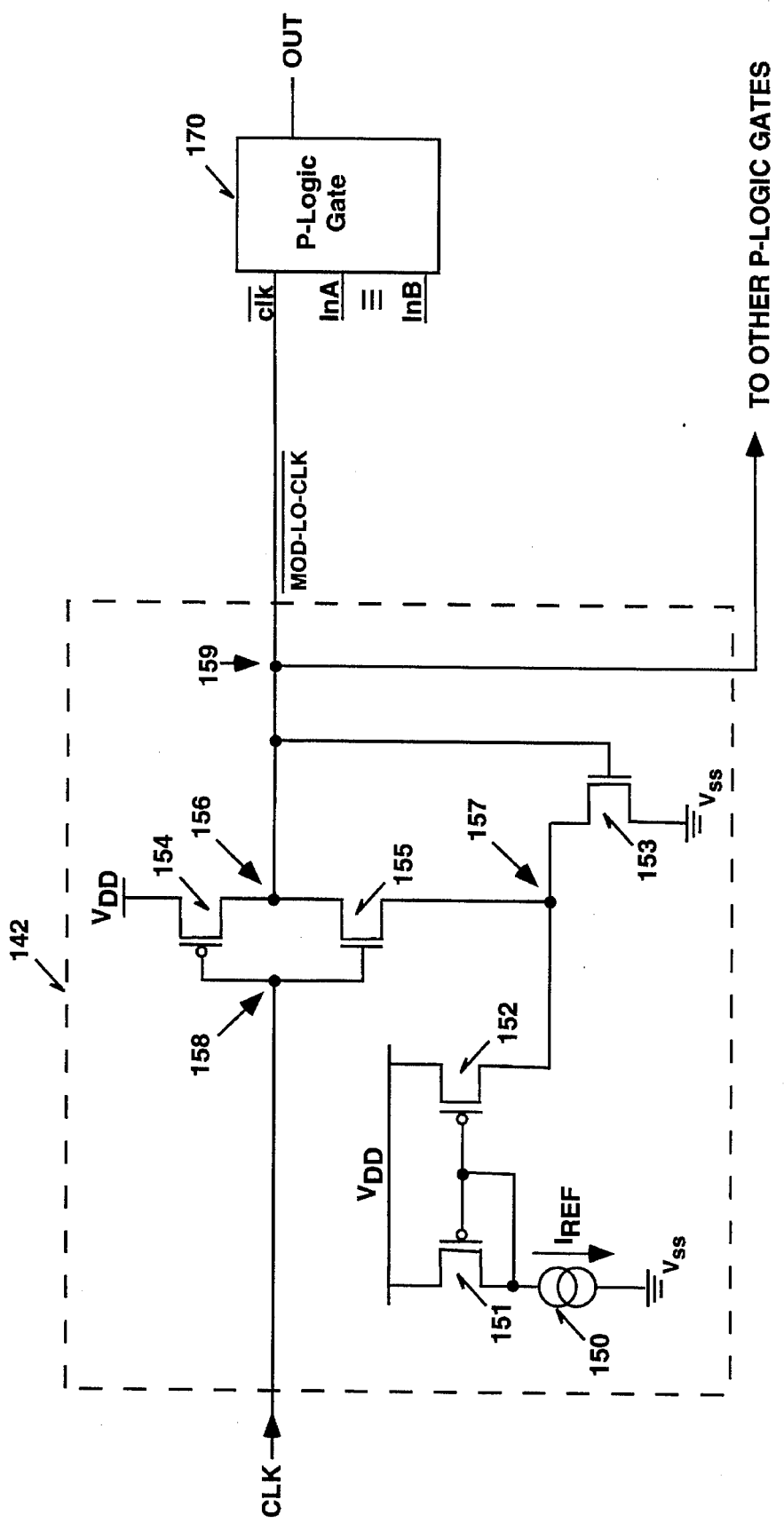
FIG. 11b shows, in a block diagram form, a generic dynamic CMOS logic gate (with a P-logic network) and its clock driver circuit according to the present invention.
Figure 13:
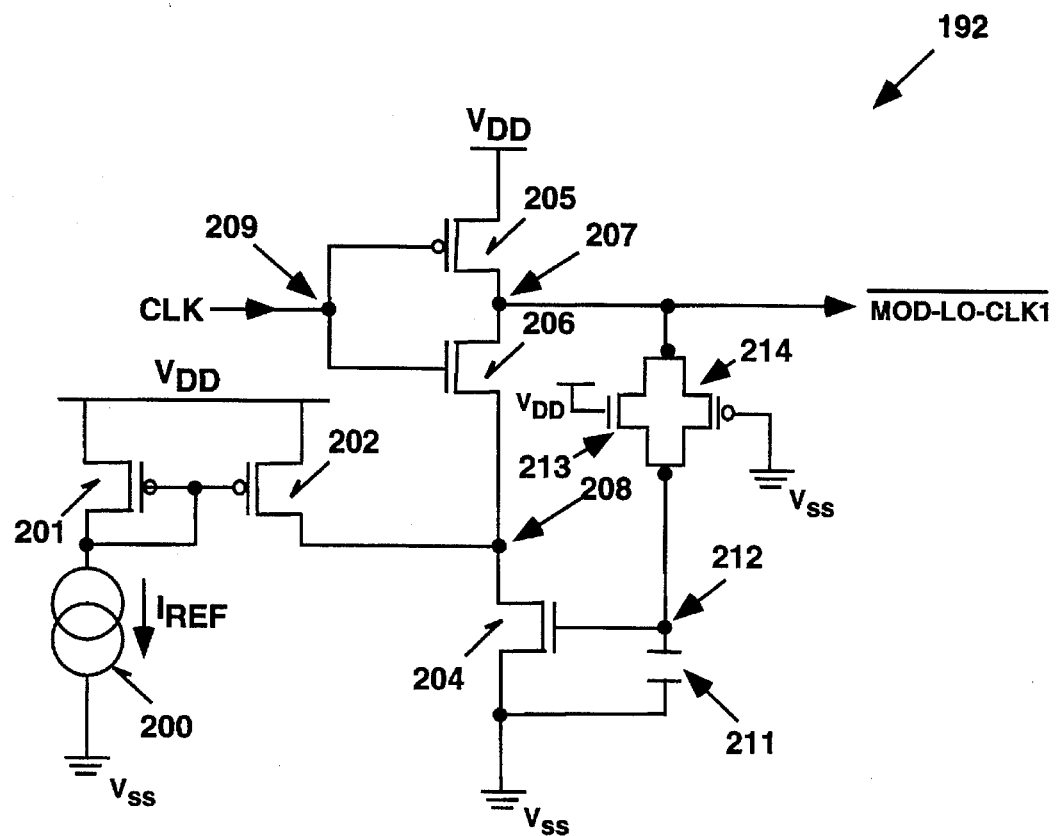
FIG. 13 is a circuit diagram of a clock driving and bias circuit for a dynamic CMOS logic gate (using a PFET logic network), according to a further embodiment of the present invention.

FIGS. 11a, 11b, and 13 present additional embodiments of clock driver circuits according to the present invention. Even though these circuits are designed to allow P-logic dynamic gates to operate statically, it should be appreciated that these circuits are basically the complements of the driver circuits which have already been described for N-logic dynamic gates. For example, the operation of the driver circuit 142 of FIGS. 11a and 11b is the complement of the operation of the driver circuit 62 of FIGS. 6a and 6b. When the input signal CLK to this driver circuit 142 is low, the output $\overline{\text{MOD-LO-CLK}}$ is $V_{DD}$, since the low CLK turns PFET 154 on and NFET 155 off.

Figure 12:
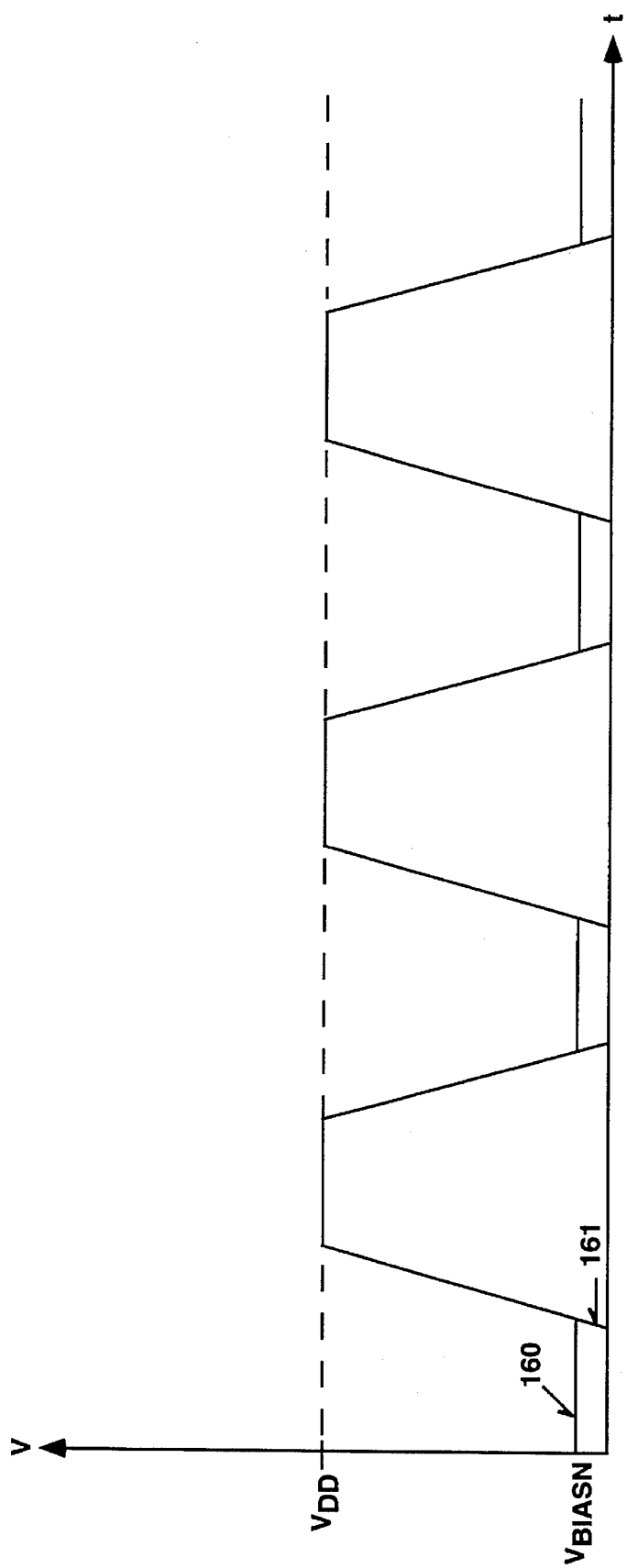
FIG. 12 is a waveform diagram representing a comparison of the clock signal $\overline{\text{MOD-LO-CLK}}$ of FIG. 11a with a conventional clock signal $\overline{\text{CLK}}$ for a P-logic gate.

When the input clock signal CLK is high, the driver 142 causes precharging and PFET 154 is off and NFET 155 is on, which in turn pulls $\overline{\text{MOD-LO-CLK}}$ to the low potential at node 157. The voltage at node 157 during precharging is the bias voltage ($V_{BIASN}$) and is equal to $V_{SS}$ plus the voltage drop across NFET 153; this voltage drop across NFET 153 is dependent on the current that flows through it, and is small enough to force the precharge NFET 144 (which might also be called the discharge NFET) to conduct current in the subthreshold conduction region. Also, since the current through NFET 153 is controlled by the current mirror (formed by PFETs 151 and 152) and current source 150, the ideal value of the $V_{BIASN}$ can be obtained by simply adjusting the parameters of the PFETs 151 and 152 and current source 150. Finally, FIG. 12 shows the $\overline{\text{MOD-LO-CLK}}$ signal curve 160 that driver clock circuit 142 produces, and compares this curve to the curve 161 of a conventional clock signal for a P-logic gate. The difference between the conventional clock signal and the $\overline{\text{MOD-LO-CLK}}$ signal can also be seen in FIG. 7b were the conventional signal is waveform 701 and the $\overline{\text{MOD-LO-CLK}}$ signal is shown as waveform 705.

Figure 14:
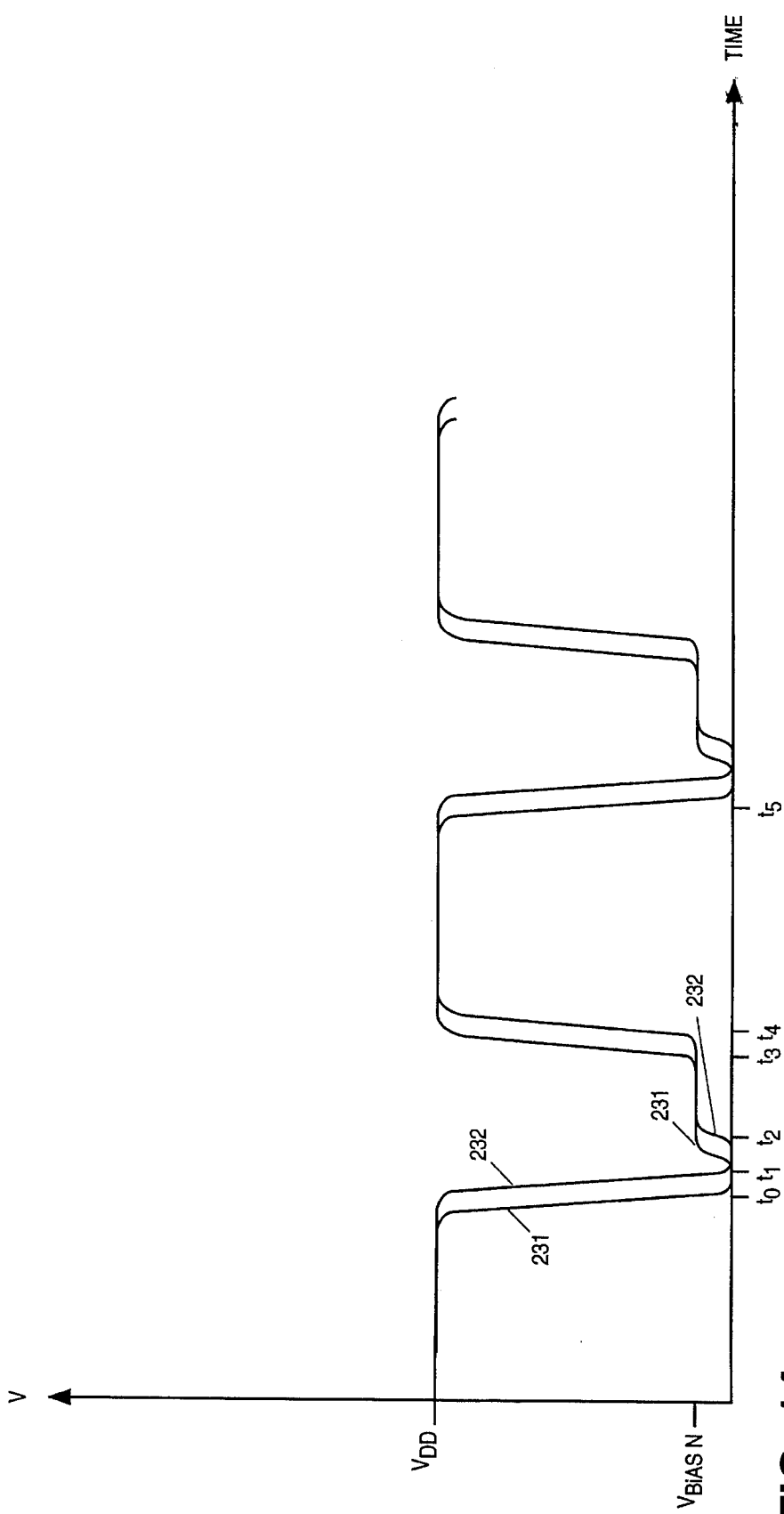
FIG. 14 is a waveform diagram representing a comparison of the clock $\overline{\text{MOD-LO-CLK1}}$ of FIG. 13 with a conventional clock signal $\overline{\text{CLK}}$ for a P-logic gate.

FIG. 13 shows a driver clock circuit 192 which is the compliment of clock circuit 112 presented in FIG. 9, and like circuit 112 this clock circuit 192 delays the generation of the bias voltage. During the operation of this driver circuit 192, when the input clock signal CLK is low (which occurs during the evaluation phase), the output signal $\overline{\text{MOD-LO-CLK1}}$ is substantially equal to $V_{DD}$ because PFET 205 is on and NFET 206 is off. At this point in time when $\overline{\text{MOD-LO-CLK1}}$ is substantially at $V_{DD}$, note that the gate of NFET 204 is also substantially at $V_{DD}$, and capacitor 211 is charged to substantially $V_{DD}$. On the other hand, when the input clock signal CLK transitions from low to high, PFET 205 turns off and NFET 206 turns on. This initially causes the $\overline{\text{MOD-LO-CLK1}}$ signal to be pulled down to $V_{SS}$, since NFET 204 is turned on hard during the initial period of the evaluate phase as charged capacitor 211 (which during the previous precharge phase charged up to $V_{DD}$) provides the gate of NFET 204 with a $V_{DD}$ voltage. However, after a short time (which is equal to the product of the capacitance of capacitor 211 and the resistance of the resistor network formed by NFET 213 and PFET 214) capacitor 211 loses all its charge and NFET 204 acts as a pseudo-diode. Consequently, $\overline{\text{MOD-LO-CLK1}}$ rises to a $V_{BIASN}$, which equals $V_{SS}$ plus the voltage drop across NFET 204. FIG. 14 shows $\overline{\text{MOD-LO-CLK1}}$ curve 231 produced by clock driver 192 and compares this curve to curve 232, which represents the charge on capacitor 211.

Figure 2A:
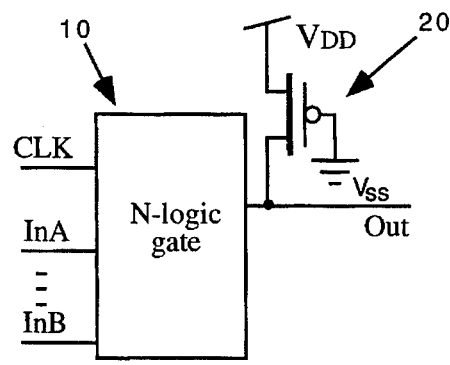
FIGS. 2a through 2c illustrate variations of prior art dynamic CMOS logic gates.
Figure 2B:
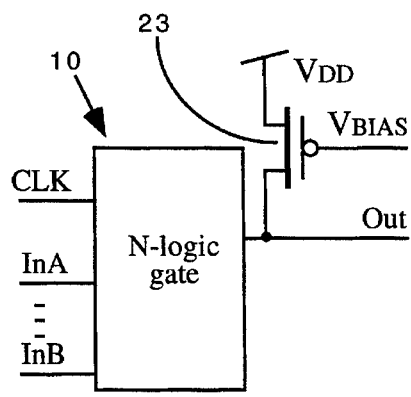
Figure 2C:
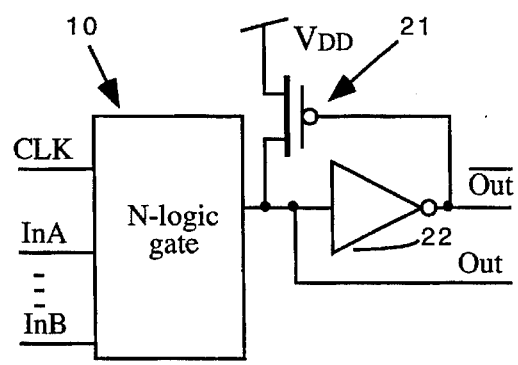
Figure 3A:
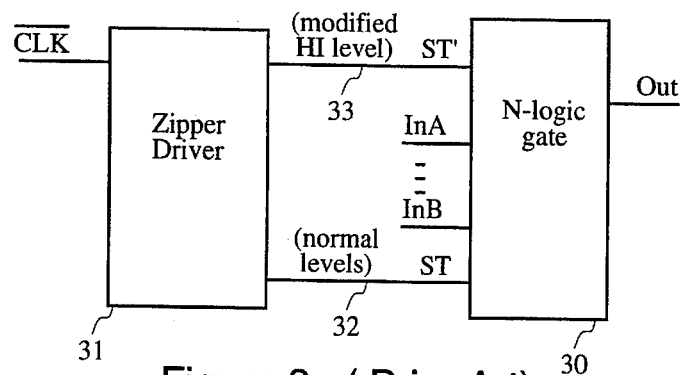
FIGS. 3a through 3c illustrate another prior art dynamic CMOS logic gate.
Figure 3B:
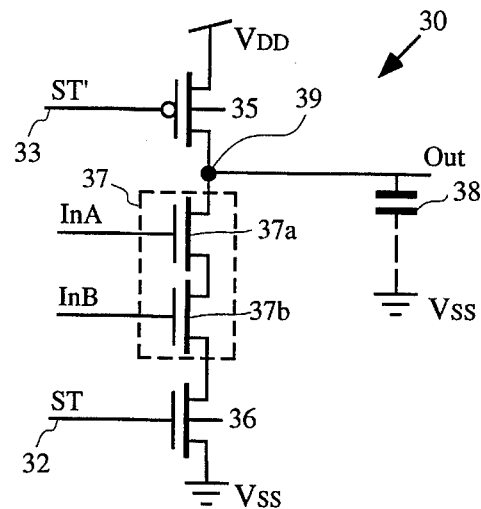
Figure 3C:
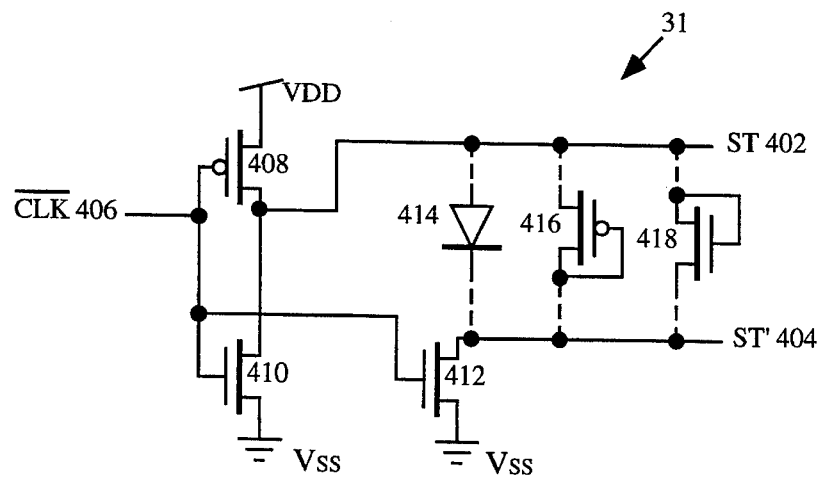
Figure 4:
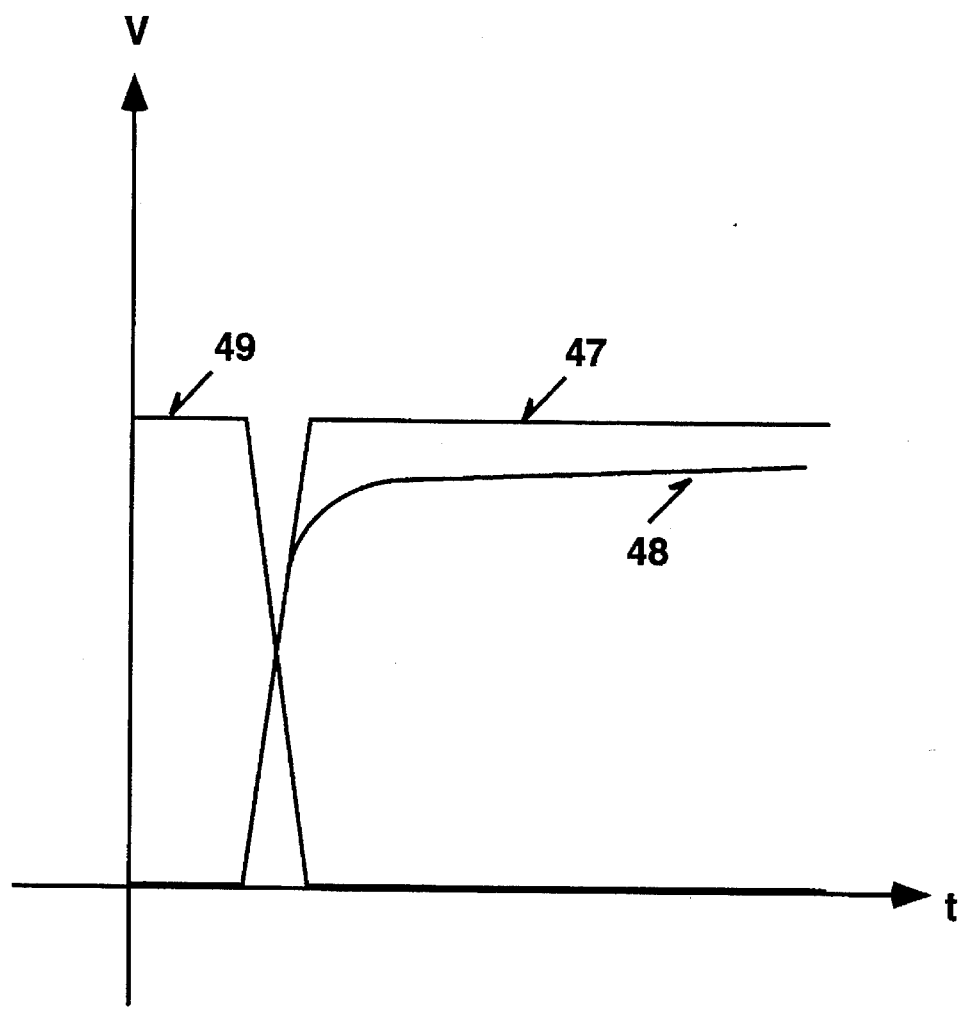
FIG. 4 is a waveform diagram illustrating the ST and ST' clock signals of FIGS. 3a–3c.
Figure 15A:
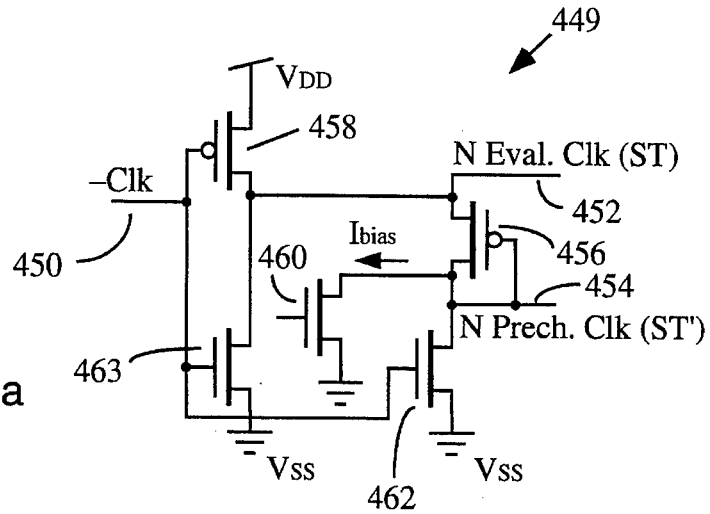
FIG. 15a depicts a zipper clock driver modified according to the present invention.

Another embodiment of the present invention is shown in FIGS. 15a, which presents a zipper clock driver 449 that has been improved according to the present invention. This driver circuit 449 produces two output clock signals, ST 452 and ST' 454, to control NFET evaluate transistors and PFET precharge transistors respectively. Also, this driver circuit 449 is a modification of zipper driver circuit 31 of FIG. 3c, when driver circuit 31 uses PFET 416 to create an offset between the high level of ST 402 and the high level of ST' 404. As mentioned before, one of the problems of zipper driver circuit 31 that uses PFET 416 is the reduction of the offset voltage and the increase of the high level of ST' 404, which completely turns off the PFET precharge transistor during the evaluation phase.

Driver circuit 449 solves this problem of driver circuit 31 by controlling the offset voltage, between the high level of ST 452 and the high level of ST' 454. This driver circuit 449 controls the offset voltage by establishing a bias current through PFET 456 and by controlling this bias current with the use of a current mirror (only part of which is shown in FIG. 15a by NFET 460) and a current source (which is not shown in FIG. 15a). Consequently, since the offset voltage is controlled by the current minor and the current source, specific values of the offset voltage can be maintained and thus zipper clock driver circuit 449 does not suffer from the problems caused by a degrading offset voltage. In addition, this driver circuit's 449 control over the offset voltage makes driver circuit 449 superior to driver circuit 31 (which cannot control its offset voltage) in a second manner. Driver circuit 449 allows one to easily obtain any desired keep alive current through a precharge P-channel transistor by simply adjusting the offset voltage (by varying the parameters of the current mirror or the current source) to produce the desired $V_{BIASP}$; however, driver circuit 31 cannot produce any desired keep alive current, since it cannot control the offset voltage. It will be appreciated that the current mirror for driver 449 may be constructed in a manner analogous to the current mirror of driver 62 of FIG. 6a where NEFT 72 is analogous to NFET 460. Thus, the gate of NFET 460 is coupled to the gate of another NFET which has its source coupled to $V_{SS}$ and its drain coupled to a current reference source such as $I_{REF}$. As an alternative to using a current mirror, a controllable reference voltage may be applied to the gate of NFET 460.

Figure 15B:
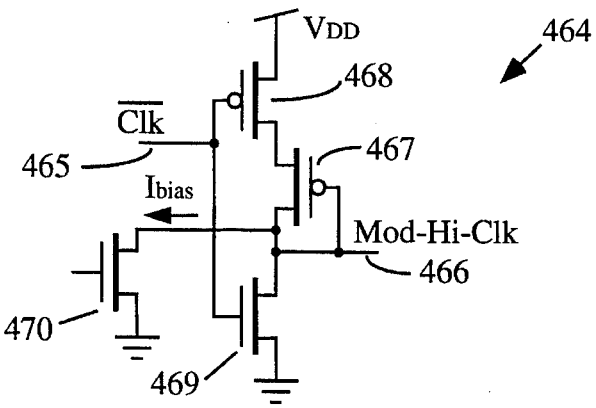
FIG. 15b shows an alternative modified hi clock driver of the present invention.
Figure 18:
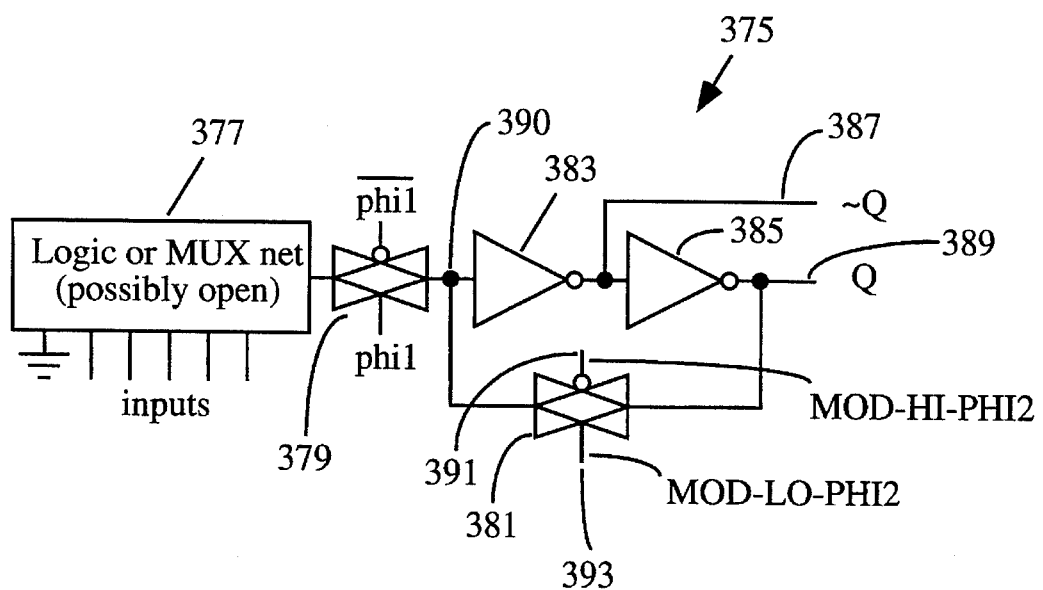
FIG. 18 shows the use of the present invention with semi-static transmission gate latches.

FIG. 15b presents another clock driver circuit according to the present invention. This clock driver circuit 464 produces a modified high clock output signal, in order to turn on an N-logic gate's precharge transistor in the subthreshold conduction region during the evaluate phase. During the operation of driver circuit 464, when the input signal $\overline{CLK}$ is high, the output signal CLK is pulled to $V_{SS}$ because NFET 468 turns on and PFET 468 turns off. On the other hand, when the $\overline{CLK}$ signal turns low, PFET 468 turns on and NFET 469 turns off. This in turn pulls CLK 466 (the output signal) to the modified high voltage level, which is an offset voltage below $V_{DD}$. This offset voltage is the voltage drop across the diode connected PFET 467 and is controlled by the bias current that a current mirror (only part of which is shown in FIG. 18b as NFET 470) and a current source (not shown in FIG. 18b) establish through PFET 467. It will be appreciated that the current mirror for the driver 464 may be constructed in a manner analogous to the current mirror of driver 62 of FIG. 6a where NFET 72 is analogous to NFET 470. Thus, the gate of NFET 470 is coupled to the gate of another NFET which has its source coupled to $V_{SS}$ and its drain coupled to a current reference source such as $I_{REF}$. As an alternative to using a current mirror, a controllable reference voltage may be applied to the gate of NFET 470.

Figure 7B:
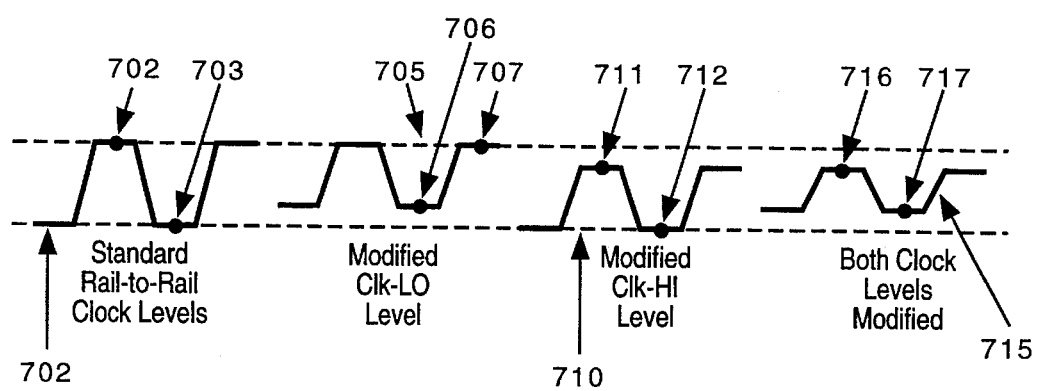
FIG. 7b shows a waveform diagram depicting prior art clock signals and clock signals according to the present invention.
Figure 15C:
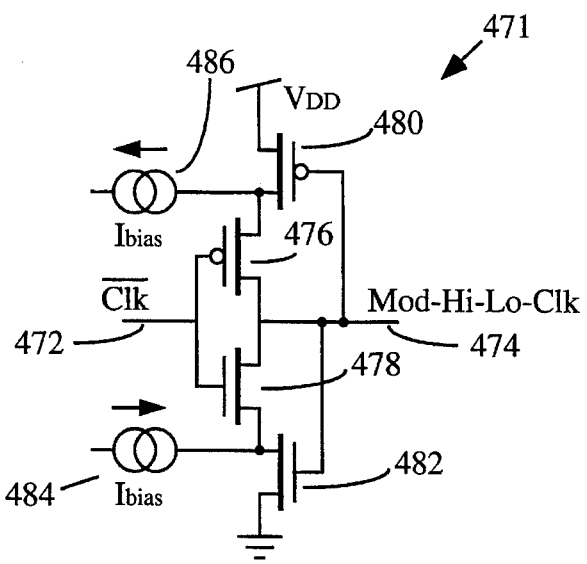
FIG. 15c shows an alternative clock driver of the invention which provides modified high and low levels.

Yet another embodiment of the present invention is shown in FIG. 15c, which illustrates a clock driver circuit 471 that provides a modified high and modified low clock output signal. Clock waveform 715 of FIG. 7B shows an example of such a clock output signal having both a modified high level and a modified low level. The modified high level maintains an N-logic gate's precharge transistor in the subthreshold region during the N-logic evaluate phase, while the modified low level maintains a P-logic gate's precharge transistor in the subthreshold region during the other phase used as the P-logic evaluate phase. The modified high clock output signal is produced when the input signal $\overline{CLK}$ is low, since a low $\overline{CLK}$ signal turns on PFET 476 and turns off NFET 478. Consequently, the output signal CLK 474 is pulled up to the modified high voltage level, which is an offset voltage below $V_{DD}$. This offset voltage is the voltage drop across PFET 480 and is controlled by the bias current that a reference current source 486 establishes in PFET 480.

The modified low clock output signal is produced when the input signal $\overline{CLK}$ is high, since a high $\overline{CLK}$ signal turns off PFET 476 and turns on NFET 478. Consequently, the output signal CLK 474 is pulled down to the modified low voltage level, which is an offset voltage above $V_{SS}$. This offset voltage is the voltage drop across NFET 482 and is controlled by the bias current that a reference current source 484 establishes in NFET 482.

Figure 16:
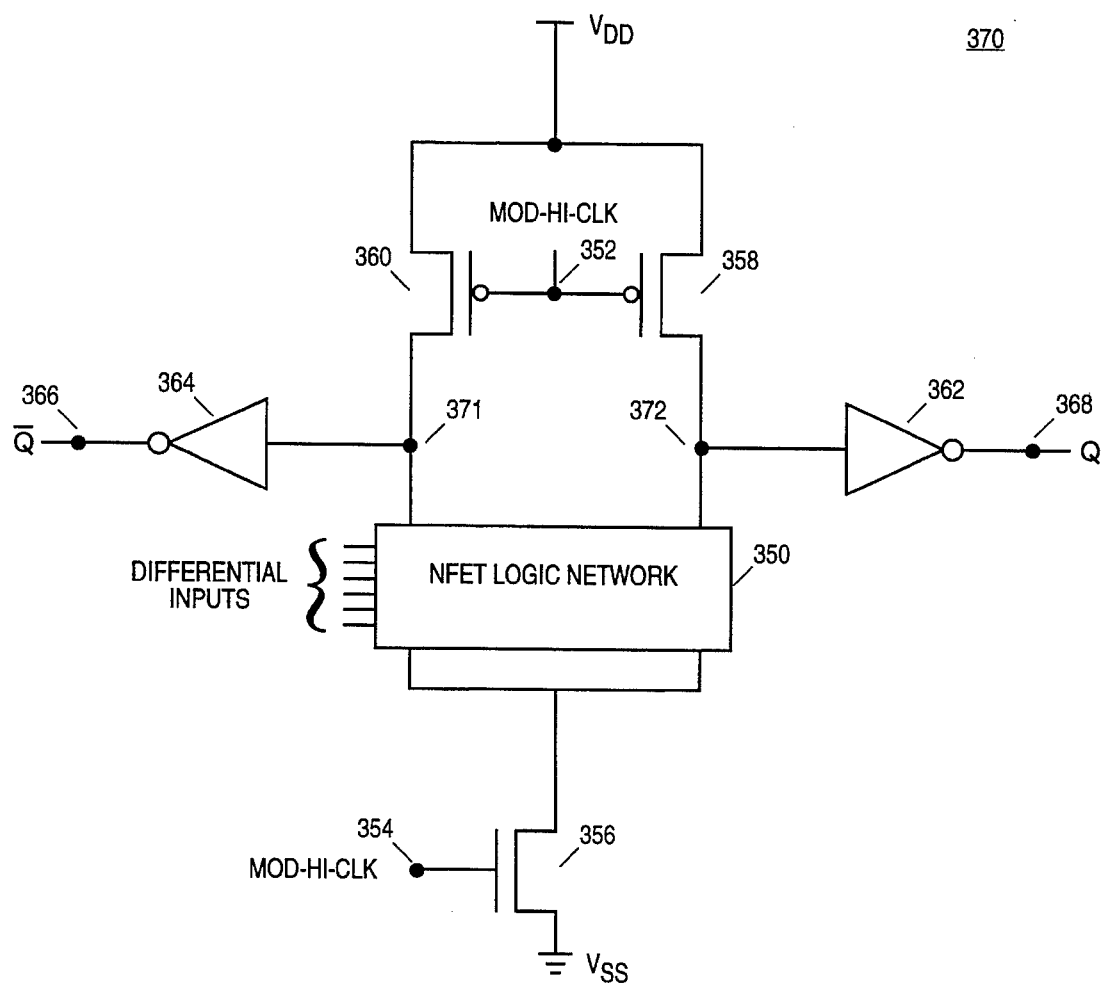
FIG. 16 shows the use of cascode voltage switch logic (CVSL) with the present invention.

FIG. 16 presents another dynamic gate which can operate statically if an embodiment of the present invention is used. The CMOS logic gate presented in FIG. 16 is a cascode voltage switch logic (CVSL) gate 370. This circuit comprises two complementary N-logic switch structures (which in FIG. 16 are encompassed in NFET logic network 350), that are connected to two precharge transistors (PFET 358 and PFET 360) and to one evaluate transistor (NFET 356). During the operation of CVSL 370, when the clock signal MOD-HI-CLK (applied to nodes 352 and 354) has a low voltage level, nodes 371 and 372 are first precharged to $V_{DD}$, which in turn pulls down both outputs (Q 368 and $\overline{Q}$ 366) of CVSL 370 to $V_{SS}$.

During the evaluation phase the voltage level of the clock signal MOD-HI-CLK is high, which turns on the evaluate transistor 356. In addition, during the evaluate phase, only one output voltage is pulled to a high voltage level because only one path through the evaluate transistor to $V_{SS}$ is created by the complementary logic networks. In other words, during the evaluate phase, CVSL 370 produces two complementary signals because it consists of two complementary logic networks. The operation of CVSL gates are well known; see, for example, pages 169–171 of Weste and Eshraghian.

Unfortunately, these complementary output signals cannot be maintained by CVSL 370 during static conditions, if the high clock level completely turns off the precharge transistors; when PFETs 358 and 360 are turned off for an extended period of time (e.g. the clocks are stopped), both outputs of CVSL 370 reach the low voltage level since leakage currents cause the charged node that has not discharged to $V_{SS}$ (during the initial period of the evaluate phase) to also lose its charge. However, the embodiments of the present invention that produce a modified high clock level can be used to maintain the complementary outputs of CVSL 370, even when the clock is stopped during the evaluate phase. For example, if during the evaluation period Q turns high and $\overline{Q}$ stays low, the clock signal MOD-HI-CLK 79 of clock driver circuit 62 of FIG. 6a can be used to turn on PFET 360 in the subthreshold conduction region. This in turn enables PFET 360 to provide node 371 a keep alive current that offsets the leakage current and maintains the high voltage level of node 371.

Figure 17:
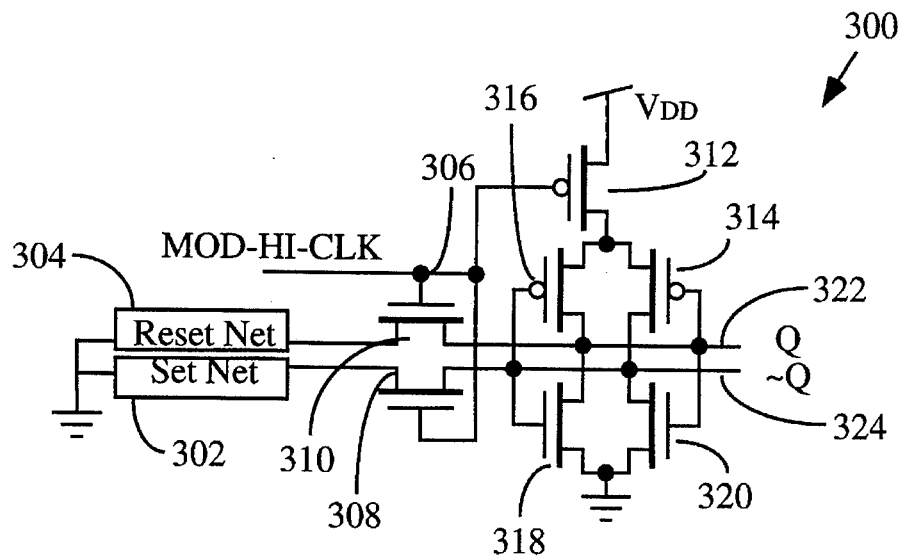
FIG. 17 illustrates the use of the present invention with complementary set-reset logic (CSRL)

The present invention can also be applied to certain kinds of prior art latch cells that have the capability accepting new data or dynamically holding old data. Two such latches are known as the CSRL latch 300, shown in FIG. 17, and the semi-static latch 375, shown in FIG. 18. In these cases, one or more logic networks serve to compute a new state for the latch during an input phase of the clocks, and the latch stores the state statically using a positive feedback arrangement during the latch phase of the clocks. The CSRL latch uses two N-logic networks 302 and 304 to pull either output Q or output Q-bar to a logic 0 level, while the semi-static latch uses a single transmission-gate network 377 to pull the latch state to either a logic 0 or a logic 1 level. That is, the form of the logic networks depends on the form of the latching mechanism, and there are not necessarily logic gate circuits separate from the storage circuits.

If any of these latch/logic techniques, it is possible for the logic network 377, or both logic networks 302 and 304 in the case of CSRL, to be in an open-circuit configuration during the input phase, in which case the logical intent is for the latch to retain the previously stored data state. During the input phase, if the logic networks are open, the state is stored dynamically as stored charge the maintains the stored logic levels. In the CSRL latch, the clock switches on power-up transistor 312 to provide power to enable positive feedback during the latch phase when clock 306 is low, and switches it off to enable a new state to enter during the input phase when clock 306 is high. In semi-static latch 375, positive feedback is supplied through transmission gate 381, which is a symbol for an NFET and a PFET in parallel with complementary clock signals on their gate terminals, during the latch phase when clock 391 (MOD-HI-PHI2-bar) is low and clock 393 (MOD-LO-PHI2) is high; during the input phase, the transmission gate is opened, disabling positive feedback. In both cases, the stored state is subject to degradation and error during the input phase if the logic networks are open and prior-art clock levels are used.

By analogy with the application of modified-level clocks to maintain a precharged level when a pulldown logic network is open, we can apply modified-level clocks to these latch circuits to maintain a stored data state when the logic networks are open, In either case, the positive feedback mechanism is weakly enabled, rather than completely disabled as is done in the prior art.

In CSRL circuit 300, the stored state can be made static by biasing power-up transistor 312 into a subthreshold conduction state, by driving its MOD-HI-CLK 306 from a driver such as driver 62 shown in FIG. 6, or one of the other variants disclosed. An inverted version of the CSRL latch with NFET power-up transistor and P-logic set and reset networks is also possible, and would be made static by clocking it with a MOD-LO-CLK driver.

In semi-static circuit 375, the stored state can be made static by biasing into a subthreshold conduction state both the NFET and the PFET of feedback transmission gate 381, by driving the PFET with clock MOD-HI-PHI2-bar 391 from a driver such as driver 62 shown in FIG. 6, and the NFET with clock MOD-LO-PHI2 393 from a driver such as driver 142 shown in FIG. 11, or other variants disclosed. The two clocks applied to transmission gate 381 remain logically complementary as in the prior art, but do not use identical voltage levels due to their different functional needs.

Other logic/latch circuit forms that use switched positive feedback can similarly benefit by application of the modified-level clock drivers of the present invention to change the feedback off phase to a very weakly on feedback condition that will make up for charge leakage when on new state is applied and the old state value needs to be kept at the internal logic state storage node.

Figure 19:
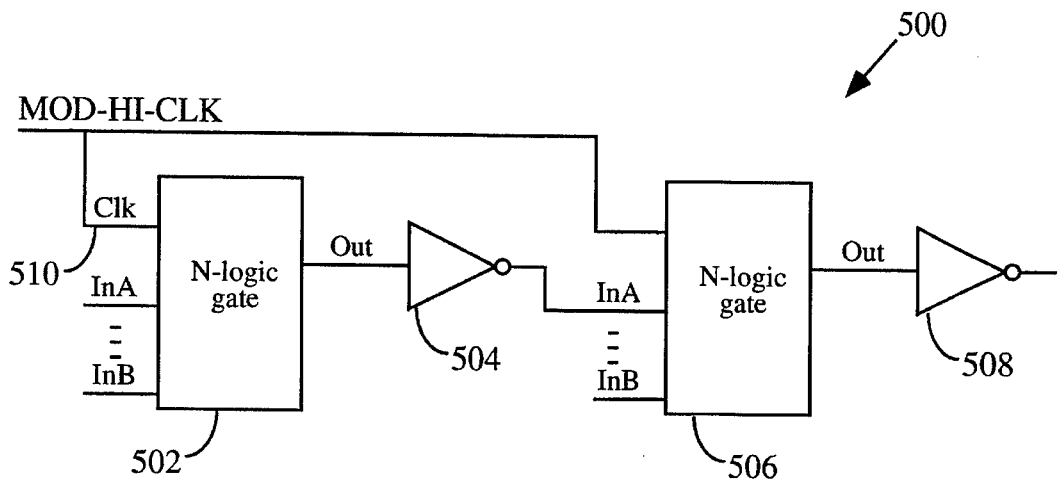
FIG. 19 illustrates the use of the present invention with domino CMOS logic.

A driver circuit according to the present invention can also make the domino logic gate 500 shown in FIG. 19 operate statically. Domino logic consists of numerous cascaded dynamic CMOS logic gates, each of which has its output connected to an input of the next logic network via a static inverter; see, for example, the discussion of domino logic at pages 168–169 of Weste and Eshraghian. For example, FIG. 19 shows that inverter 504 inverts the output of dynamic CMOS gate 502 and supplies this inverted output to input terminal A of dynamic CMOS gate 506. The use of the static inverter is essential for cascading the logic gates, because without the use of the inverter race conditions (e.g. the clock signal arrives at the second gate before the output at the first gate stabilizes) could lead to logic errors.

As was discussed for the dynamic logic gates of FIG. 1a through 1d (and numerous others cited above), the output of a dynamic logic gate is degraded by leakage currents when the clock frequency is reduced. This problem can be remedied by a clock driver circuit of the invention that produces a modified high clock level (e.g. MOD-HI-CLK signal) in the case of an N logic gate or a modified low clock level in the case of a P logic gate. Therefore, with the use of a driver circuit (e.g. driver 62 of FIG. 6a) that produces a modified high clock level according to the present invention, Domino logic 500 can be made to operate statically. Thus, as shown in FIG. 19, the MOD-HI-CLK signal is applied to the clock input of N-logic gates 502 and 506.

Figure 20:
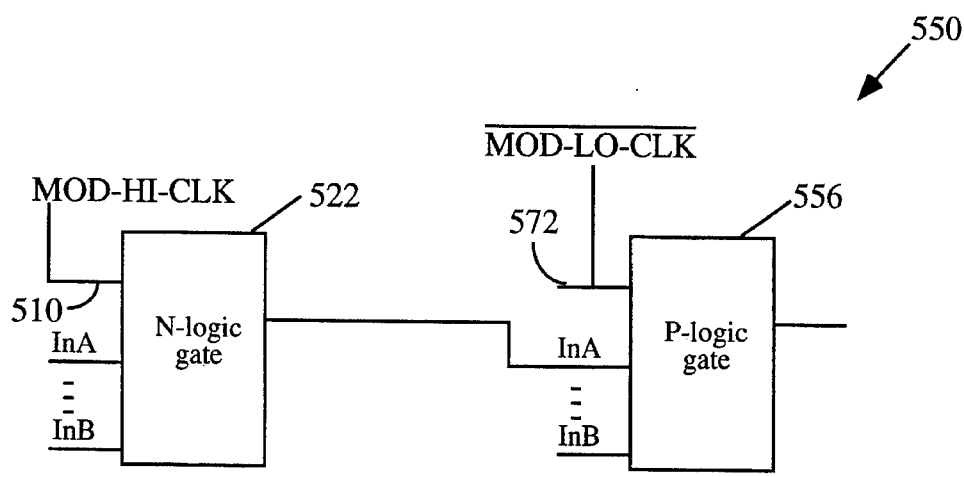
FIG. 20 shows the use of the present invention with a dynamic CMOS logic family known as NORA.

FIG. 20 presents a NORA logic circuit, which can also be made to operate statically by a driver circuit according to the present invention. NORA logic is basically the same as Domino logic except that the buffers (e.g. static inverters) are removed and the cascaded logic blocks are alternatively P and N logic blocks. For example, FIG. 20 shows the output of N-logic gate 552 connected to input terminal A of P-logic gate 556.

Like the dynamic gates of Domino logic, the output of the dynamic logic gates of NORA logic is degraded by leakage currents when the clock frequency is reduced. Also, like the dynamic gates of Domino logic, this problem can be solved for the N-logic gates of NORA logic by a driver circuit of the invention (e.g. driver 62) that produces a modified high clock level; this modified voltage causes the PFET precharge transistors (of the N-logic gates of NORA logic) to operate in the subthreshold conduction region during the evaluate phase. In addition, the output voltage of P-logic gates can be maintained statically by providing the precharge transistor of P-logic gate with a modified low clock level from a clock driver such as driver 142 during the evaluate phase; this modified voltage turns on the precharge NFETs in the subthreshold region. Therefore, with the use of a driver circuit of the invention that produces a modified high clock level and a driver circuit of the invention that produces a modified low clock level according to the present invention, NORA logic circuit 550 can be made to operate statically. Thus, as shown in FIG. 20, the N-logic gate 552 receives the MOD-HI-CLK signal, and the P-logic gate 556 receives the MOD-LO-CLK-bar signal at their respective clock inputs.

Figure 21:
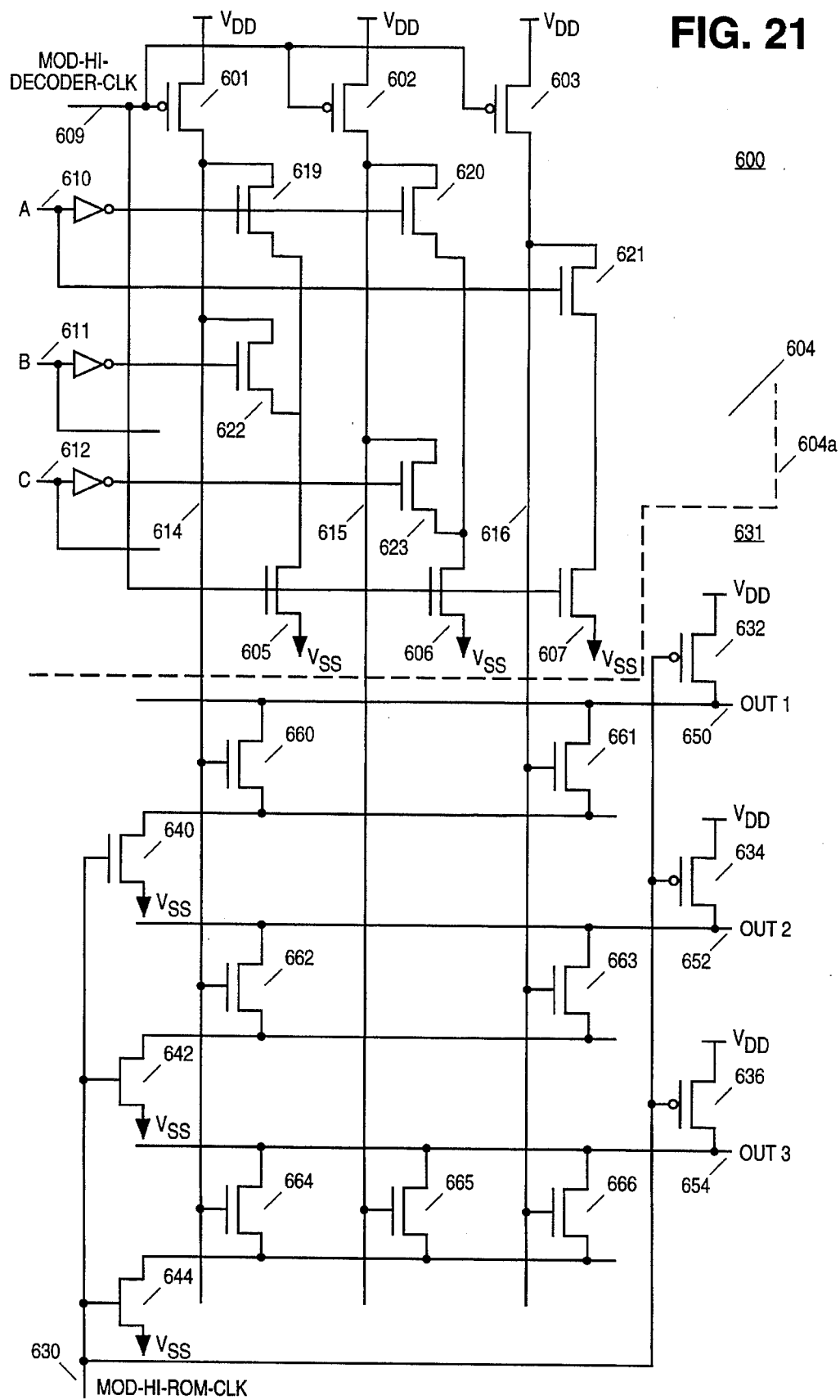
FIG. 21 illustrates the use of the present invention with a dynamic CMOS PLA (programmable logic array) or a ROM (read only memory).

A clock driver circuit according to the present invention can also make dynamic CMOS programmable logic array (PLA) 600 of FIG. 21 operate statically. Dynamic CMOS PLAs are well known in the art; see, for example, pages 218–221 of Shoji, M., *CMOS Digital Circuit Technology,* Prentice Hall, Englewood Cliffs, N.J. (1988). During one machine cycle, this PLA performs its functions in four phases using a decoder clock and a ROM clock. During the first phase, when MOD-HI-DECODER-CLK turns low, word lines 614, 615, 616, are precharged by PFETs 601, 602, and 603 of decoder stage 604. Note that dashed line 604a represents the conceptual boundary between the decoder portion 604 of the PLA and the ROM portion 631 of the PLA. During the second phase, when MOD-HI-DECODER-CLK turns high, the evaluate transistors 605, 606, and 607 are turned on, and inputs A 610, B 611, and C 612 cause some of the NOR gates (NFETs 619, 620, 621, 622, and 623) of decoder 604 to discharge; also, during the second phase, the MOD-HI-ROM-CLK turns low and thus bit lines 650, 652 and 654, also designated as Out 1, Out 2, Out 3 (which represent the outputs of the PLA) of ROM stage 631 are precharged by PFETs 632, 634, and 636. During the third phase, when MOD-HI-ROM-CLK turns high, NFETs 640, 642, and 644 are turned on, and the signals on the word lines that were produced in the second phase cause some of the NOR gates (some of NFETs 660 through 666) of ROM stage 631 to discharge; consequently, during this third phase, some of the bit lines are pulled down to $V_{SS}$. In the fourth phase, these output signals are routed to their destination.

The performance of PLA 600 may be improved by using the present invention to cause it to operate statically. Note that during the second, third and fourth phases leakage currents reduce the high voltage level of the bit lines that were not discharged initially during the evaluate phase, and thus the PLA cannot operate statically. This problem can be remedied by using a driver circuit of the invention that produces a modified high clock level (e.g. driver circuit 62 of FIG. 6a), in order to make PFETs 632, 634, and 636 operate in the subthreshold conduction region during the evaluate phase of ROM 631. An output node of the PLA that needs to maintain its high voltage level can now rely on the subthreshold current provided by its PFET to offset the leakage current and thus the PLA can be operated statically, allowing the ROM clock to be slowed or to stop. It will be appreciated that ROM and RAM arrays, for the purpose of this invention, operate in a manner which is similar to the PLA array of FIG. 21, and consequently, it would be apparent to those in the art that dynamic ROM and RAM arrays may be made static by applying the present invention to these arrays.

Finally, in the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A dynamic logic circuit, comprising:
   (A) a logic network circuit having a first end coupled to an output node and a second end, wherein the logic network circuit is coupled to receive at least one logic input for performing a predefined logic function with respect to the logic input;
   (B) a precharging transistor having a subthreshold conduction region for precharging the output node to a first voltage state, wherein the precharging transistor includes a first terminal coupled to a first supply voltage, a second main terminal coupled to the output node, and a control terminal;
   (C) an evaluation transistor for allowing the logic network circuit to selectively charge the output node to a second voltage state in accordance with the predefined logic function with respect to the logic input, wherein the evaluation transistor includes a first terminal coupled to the second end of the logic network circuit, a second terminal coupled to a second supply voltage, and a control terminal; and
   (D) circuitry coupled to the control terminal of the precharging transistor and the evaluation transistor, wherein the circuitry includes
      (i) a current source for providing a reference current;
      (ii) a first transistor for generating a bias voltage, wherein the bias voltage has a voltage level that is less than one threshold voltage different from the first voltage state and causes the precharging transistor to operate in the subthreshold conduction region;
      (iii) current control means coupled to the current source and the first transistor for causing a constant current relative to the reference current to flow through the first transistor such that the first transistor generates the bias voltage;
      (iv) switching means coupled to the first transistor and being responsive to a control signal for selectively coupling the control terminal of the precharging transistor and evaluation transistor to one of (1) the control signal and (2) the bias voltage, wherein when the switching means couples the control terminal of the precharging transistor and the evaluation transistor to the control signal under the control of the control signal, the precharging transistor is turned on and the evaluation transistor is turned off such that the output node is charged to the first voltage state, wherein when the switching causes the control terminal of the precharging transistor and evaluation transistor to receive the bias voltage under the control of the control signal, (1) the evaluation transistor is turned on to allow the logic network circuit to selectively charge the output node to the second voltage state according to the predefined logic function of the logic input and (2) the precharging transistor is turned to operate in a subthreshold conduction region so as to allow a substantially reduced current to flow through to maintain the output node at the first voltage state when the logic network circuit does not charge the output node to the second voltage state such that the dynamic logic gate circuit can operate statically: and
   (v) delay means coupled to a control terminal of the first transistor for causing the first transistor to delay generating the bias voltage for a predetermined time interval after the precharging transistor is completely turned off by the control signal.

2. The dynamic logic circuit of claim 1, wherein the precharging transistor comprises an NFET and the evaluation transistor comprises a PFET, and wherein the logic network circuit comprises a PFET logic network circuit.

3. The dynamic logic circuit of claim 1, wherein the precharging transistor comprises a PFET and the evaluation transistor comprises an NFET, wherein the logic network circuit is an NFET logic network circuit.

4. The dynamic logic circuit of claim 1, wherein the first transistor is connected as a diode.

5. A clock driver circuit providing a clock signal
   (A) wherein the clock signal comprises:
      (i) a first voltage level that causes a transistor of a first conductivity type to operate in the subthreshold conduction region; and
      (ii) a second voltage level that causes a transistor of a conductivity type complementary to the first conductivity type to operate in a subthreshold conduction region; and
   (B) wherein the clock driver circuit comprises:
      (i) first current source means for providing a first reference current;
      (ii) first transistor means for generating the first voltage level;
      (iii) first current control means coupled to the first current source means and to the first transistor means for causing a first constant current relative to the reference current to flow through the first transistor means, wherein the first voltage level is dependent on the first constant current;
      (iv) second current source means for providing a second reference current;
      (v) second transistor means for generating the second voltage level;
      (vi) second current control means coupled to the second current source means and to the second transistor means for causing a second constant current relative to the second reference current to flow through the second transistor means, wherein the second voltage level is dependent on the second constant current; and
      (vii) delay means coupled to the first transistor means for causing the first transistor means to delay generating the first voltage level for a predetermined time interval after the transistor of the first conductivity type has been completely turned off by the clock signal.

6. A method of statically operating a dynamic logic circuit, wherein the dynamic logic circuit includes (1) a logic network circuit coupled to receive at least one logic input for performing a predefined logic function with respect to the logic input, and (2) a precharge transistor coupled to the logic network circuit, wherein the method comprises the steps of:

(A) turning on the precharge transistor to precharge an output node to a first voltage state by applying a control signal to a control terminal of the precharge transistor;

(B) turning off the precharge transistor by the control signal such that the logic network circuit can perform the predefined logic function with respect to the logic input, wherein the logic network circuit can selectively charge the output node to a second voltage state as a result of the predefined logic function with respect to the logic input;

(C) applying a bias voltage to the precharge transistor after a predetermined delay following the turning off of the precharge transistor by the control signal to cause the precharge transistor to operate in a subthreshold conduction region when the precharge transistor is turned off by the control signal so as to maintain the output node at the first voltage state when the logic network circuit does not charge the output node to the second voltage state such that the dynamic logic circuit can operate statically, wherein the bias voltage has a voltage level that is below a threshold voltage of the precharge transistor.

7. The method of claim 6, wherein the step (B) further comprises a step of turning on an evaluate transistor coupled to the logic network circuit by the control signal to allow the logic network circuit to selectively charge the output node to the second voltage state.

8. A logic circuit comprising:

a latch/logic circuit having an internal logic state storage node;

feedback enabling means coupled to said latch/logic circuit for enabling feedback to maintain a latched data state of said internal logic state storage node; and a clock driver circuit coupled to said feedback enabling means, said clock driver circuit providing a clock signal having a first voltage level and a second voltage level, wherein said first voltage level turns on said feedback enabling means and said second voltage level causes the feedback enabling means to operate in a subthreshold conduction region to maintain said latched data state of said internal logic state storage node.

9. A logic circuit as in claim 8 further comprising further feedback enabling means coupled to said latch/logic circuit for enabling feedback and a further clock driver circuit coupled to said further feedback enabling means, said further clock driver circuit providing a clock signal having a third voltage level and a fourth voltage level, wherein said third voltage level turns on said further feedback enabling means and said fourth voltage level causes the further feedback enabling means to operate in another subthreshold conduction region.

10. A logic circuit as in claim 8 wherein the clock driver circuit comprises:

(i) current source means for providing a reference current;

(ii) first transistor means for generating the second voltage level; and (iii) current control means coupled to the current source means and the first transistor means for causing a constant bias current relative to the reference current to flow through the first transistor means, wherein the second voltage level is dependent on the constant bias current.

11. The logic circuit of claim 10, wherein the first transistor means comprises a pseudo-diode connected transistor.

12. The logic circuit of claim 10, wherein the first transistor means comprises a diode connected transistor.

13. The logic circuit of claim 10, wherein the clock driver circuit further comprises delay means coupled to a control terminal of the first transistor means for causing the first transistor means to delay generating the second voltage level for a predetermined time interval, wherein during the predetermined time interval the first transistor means generates a third voltage level that turns off the feedback enabling means.

14. The dynamic logic circuit of claim 13, wherein the delay means comprises a capacitance means and a resistance means, and wherein the predetermined time interval is derived from the resistance of the resistance means and the capacitance of the capacitance means.

15. The logic circuit of claim 8, wherein the feedback enabling means comprises feedback enabling transistor means.

16. The logic circuit of claim 15, wherein the feedback enabling means comprises transmission gate means.

17. The logic circuit of claim 16, wherein the transmission gate means comprises:

a first feedback enabling transistor; and a second feedback enabling transistor coupled in parallel with the first feedback enabling transistor.

18. A combination of a clock driver circuit and a dynamic logic circuit having an output, wherein (A) the dynamic logic circuit includes a precharge transistor that charges the output of the logic circuit to a first voltage level, the precharge transistor having a subthreshold conduction region of operation; and (B) the clock driver circuit provides a clock signal that provides a second voltage level and a third voltage level; wherein (i) the second voltage level turns on the precharge transistor, and (ii) the third voltage level is less than one threshold different from the first voltage level and causes the precharge transistor to operate in the subthreshold conduction region; and (C) the clock driver circuit includes:

(i) current source means for providing a reference current;

(ii) transistor means for generating the third voltage level;

(iii) current control means coupled to the current source means and the transistor means for causing a constant bias current relative to the reference current to flow through the transistor means, wherein the third voltage level is dependent on the constant bias current; and (iv) delay means coupled to a control terminal of the transistor means for causing the transistor means to delay generating the third voltage level for a predetermined time interval, wherein during the predetermined time interval the transistor means generates a fourth voltage level that turns off the precharge transistor.

19. The combination of claim 18, wherein the transistor means comprises a diode-connected transistor.

20. The combination of claim 18, wherein the fourth voltage level is substantially equal to said first voltage level, wherein the delay means comprises a capacitance means and a resistance means, and wherein the predetermined time interval is derived from the resistance of the resistance means and the capacitance of the capacitance means.

21. The combination of claim 20, wherein the resistance means includes a PFET and an NFET.

22. A dynamic logic circuit, coupled to a clock driver circuit providing a clock signal that has a precharge phase and an evaluate phase, comprising:

(A) a logic network having a first end coupled to an output node wherein the logic network performs a predefined logic function;

(B) at least one precharge transistor having a subthreshold conduction region and having a first terminal coupled to a first supply voltage, a second terminal coupled to the output node, and a control terminal coupled to receive the clock signal, wherein
 (i) during the precharge phase, the clock signal is at a first clock voltage level that turns on the precharge transistor and causes the turned on precharge transistor to charge the output node to a first output voltage level, and
 (ii) during the evaluate phase, the clock signal is at a second clock voltage level that is less than one threshold different from the first output voltage level and causes the precharge transistor to operate in the subthreshold conduction region such that the output node is maintained at the first output voltage level when the logic network does not charge the output node to a second output voltage level; and (C) at least one evaluate transistor coupled to said logic network and having a control terminal coupled to receive the clock signal, wherein
 (i) during the precharge phase, the first clock voltage level turns off the evaluate transistor, and
 (ii) during the evaluate phase, the second clock voltage level turns on the evaluate transistor and the logic network selectively charges the output node to a second output voltage level in accordance with the predefined logic function;

wherein the clock driver circuit includes:
 (i) current source means for providing a reference current;
 (ii) transistor means for generating the second clock voltage level, the transistor means including a diode connected transistor;
 (iii) current control means coupled to the current source means and the transistor means for causing a constant bias current relative to the reference current to flow through the transistor means wherein the second clock voltage level is dependent on the constant bias current; and delay means coupled to a control terminal of the transistor means for causing the transistor means to delay generating the second clock voltage level for an initial period of the evaluate phase, wherein during the initial period of the evaluate phase the clock signal completely turns off the precharge transistor.

23. The dynamic logic circuit of claim 22, wherein said logic network is a portion of a memory cell in a memory array or a programmed logic array.

24. The dynamic logic circuit of claim 23, wherein the delay means comprises a resistance means and capacitance means.

25. The dynamic logic circuit of claim 23, wherein the precharge transistor is a P-channel transistor, the evaluate transistor is a N-channel transistor, and the logic network is an NFET logic network.

26. The dynamic logic circuit of claim 23, wherein the precharge transistor is a N-channel transistor, the evaluate transistor is a P-channel transistor, and the logic network is a PFET logic network.

27. A dynamic logic circuit, coupled to a clock driver circuit providing a clock signal that has a precharge phase and an evaluate phase, comprising:

(A) a logic network having a first end coupled to an output node wherein the logic network performs a predefined logic function;

(B) at least one precharge transistor having a subthreshold conduction region of operation and having a first terminal coupled to a first supply voltage, a second terminal coupled to the output node, and a control terminal coupled to receive the clock signal, wherein
 (i) during the precharge phase, the clock signal is at a first clock voltage level that turns on the precharge transistor and causes the turned on precharge transistor to charge the output node to a first output voltage level, and
 (ii) during the evaluate phase, the clock signal is at a second clock voltage level that is less than one threshold different from the first output voltage level and causes the precharge transistor to operate in the subthreshold conduction region such that the output node is maintained at the first output voltage level when the logic network does not charge the output node to a second output voltage level; and (C) at least one evaluate transistor coupled to said logic network and having a control terminal coupled to receive the clock signal, wherein
 (i) during the precharge phase, the first clock voltage level turns off the evaluate transistor, and
 (ii) during the evaluate phase, the second clock voltage level turns on the evaluate transistor and the logic network selectively charges the output node to a second output voltage level in accordance with the predefined logic function;

wherein the clock driver circuit includes:
 (i) current source means for providing a reference current;
 (ii) transistor means for generating the second clock voltage level;
 (iii) current control means coupled to the current source means and the transistor means for causing a constant bias current relative to the reference current to flow through the transistor means wherein the second clock voltage level is dependent on the constant bias current; and
 (iv) delay means coupled to a control terminal of the transistor means for causing the transistor means to delay generating the second clock voltage level for an initial period of the evaluate phase, wherein during the initial period of the evaluate phase the clock signal completely turns off the precharge transistor.

28. The dynamic logic circuit of claim 27, wherein said logic network is a portion of a memory cell in a memory array or a programmed logic array.

29. The dynamic logic circuit of claim 27, wherein said transistor means includes a diode-connected transistor.

30. The dynamic logic circuit of claim 27, wherein the delay means comprises a resistance means and capacitance means.

31. The dynamic logic circuit of claim 29, wherein the precharge transistor is a P-channel transistor, the evaluate transistor is a N-channel transistor, and the logic network is an NFET logic network.

32. The dynamic logic circuit of claim 29, wherein the precharge transistor is a N-channel transistor, the evaluate transistor is a P-channel transistor, and the logic network is a PFET logic network.

33. A combination of a dynamic logic circuit coupled to a clock driver circuit, wherein (A) the dynamic logic circuit comprises:
- (i) a logic network coupled to a first output node and a second output node, wherein the logic network is coupled to receive at least one logic input for performing a predefined logic function with respect to the logic input;
- (ii) precharge transistor means for precharging the first output node and the second output node to a first voltage state, wherein the precharge transistor means has a threshold and includes a control terminal, a first terminal coupled to a first supply voltage, a second terminal coupled to the first output node, and a third terminal coupled to the second output node; and
- (iii) evaluation transistor means for allowing the logic network circuit to selectively charge either the first output node or the second output node to a second voltage state in accordance with the predefined logic function with respect to the logic input, such that the first output node and the second output node have complementary logic states, wherein the evaluation transistor means includes a control terminal, a first terminal coupled to the logic network circuit, and a second terminal coupled to a second supply voltage; and wherein (B) the clock driver circuit provides a clock signal coupled to the control terminal of the precharge transistor means and the control terminal of the evaluation transistor means that provides the second voltage state and a third voltage state, wherein
- (i) the second voltage state turns on the precharge transistor means, and
- (ii) the third voltage state is less than one threshold different from the first voltage state and causes the precharge transistor to operate in a subthreshold conduction region;

and wherein the clock driver circuit includes delay means for causing the transistor means to delay generating the third voltage state for a predetermined time interval, wherein during the predetermined time interval the clock driver circuit generates a fourth voltage state that turns off the precharge transistor means.

34. The combination of claim 33, wherein the fourth voltage state is substantially equal to the first voltage state, wherein the delay means comprises a capacitance means and a resistance means, and wherein the predetermined time interval is derived from the resistance of the resistance means and the capacitance of the capacitance means.

35. The combination of claim 34, wherein the resistance means includes a PFET and an NFET.

36. The combination of claim 33, wherein the logic network comprises two complementary logic switch structures.

37. A circuit for allowing a dynamic logic circuit to operate statically, comprising:

a logic network having at least one logic input, the logic network performing a predefined logic function with respect to the logic input, the logic network including a precharge transistor coupled to an output node of the logic network, the precharge transistor further including a control terminal and having a subthreshold conduction region of operation; and a clock driver circuit coupled to provide a clock signal to the control terminal of the precharge transistor, the clock signal turning on the precharge transistor to charge the output node to a first voltage level, the clock signal turning off the precharge transistor to allow the logic network to selectively charge the output node to a second voltage level according to the predefined logic function, the clock signal providing a bias voltage to the control terminal of the precharge transistor after a predetermined delay following the turning off of the precharge transistor to cause the precharge transistor to operate in the subthreshold conduction region when the precharge transistor is turned off, such that the output node is maintained at the first voltage level when the logic network does not charge the output node to the second voltage level, such that the logic network can operate statically.

38. The circuit of claim 37, wherein the clock driver circuit comprises a capacitance and a resistance, and wherein the predetermined delay is determined by the resistance and the capacitance.

39. The circuit of claim 38, wherein the resistance comprises a PFET transistor and an NFET transistor.

* * * * *